United States Patent [19]
Best et al.

[11] 3,930,993
[45] Jan. 6, 1976

[54] CAPACITOR TESTING AND SORTING APPARATUS

[75] Inventors: Howard S. Best, Horseheads; Daniel J. Bustraan, Big Flats; Bernard P. McDonnell, Elmira, all of N.Y.

[73] Assignee: Corning Glass Works, Corning, N.Y.

[22] Filed: Nov. 25, 1974

[21] Appl. No.: 527,067

[52] U.S. Cl................. 209/73; 209/74 M; 209/75; 209/81 R; 324/60 C
[51] Int. Cl.²................. G01R 11/52; G01R 27/26
[58] Field of Search.......... 209/73, 74 R, 74 M, 75, 209/81 R; 324/60 R, 60 C, 73 AT

[56] References Cited
UNITED STATES PATENTS

| | | | |
|---|---|---|---|
| 2,016,455 | 10/1935 | Purdy | 324/60 R X |
| 2,567,741 | 9/1951 | Smith | 209/81 R |
| 3,761,806 | 9/1973 | Napor et al. | 209/81 R X |

*Primary Examiner*—Robert B. Reeves
*Assistant Examiner*—Joseph J. Rolla
*Attorney, Agent, or Firm*—Charles W. Gregg; Burton R. Turner; Clarence R. Patty, Jr.

[57] ABSTRACT

Apparatus for testing capacitors having axial leads and for sorting the tested capacitors into various classifications or categories in accordance with the results of such tests. Capacitors having capacitance classifications within a predetermined range of such classifications are preferably sorted into a plurality of containers each having associated therewith a classification corresponding to one of said classifications within said range with each of the containers being used for storing or shipping a predetermined quantity of capacitors of a desired capacitance. Alternatively, the capacitors can be sorted into bins for storage and desired quantities of the capacitors may be later removed from the respective bins and counted for shipment or delivery thereof to customers.

15 Claims, 42 Drawing Figures

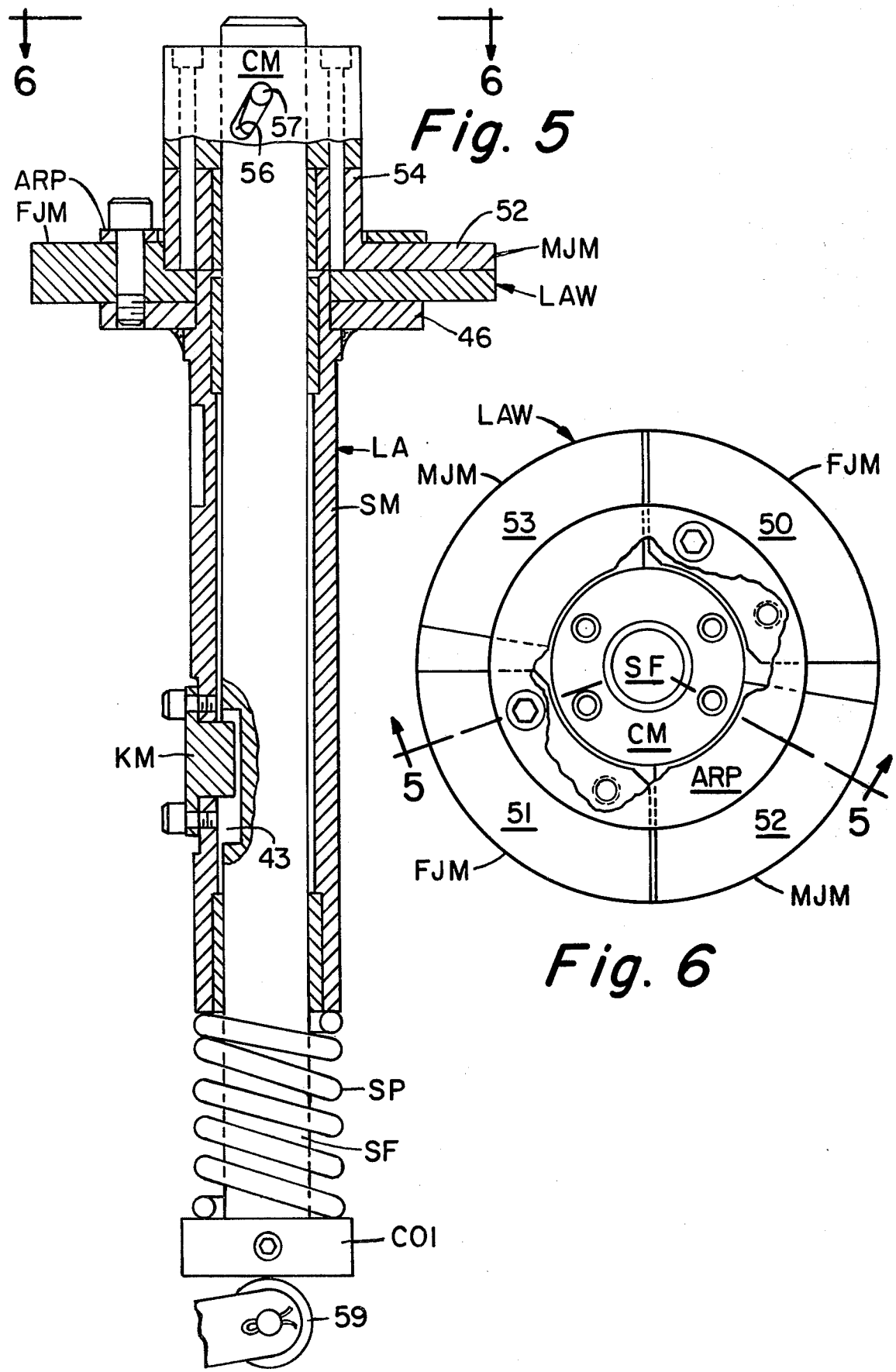

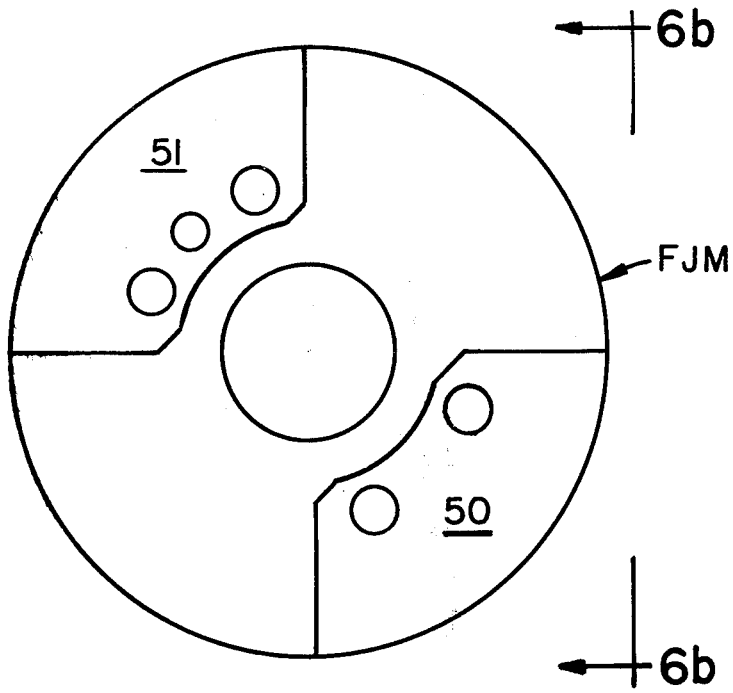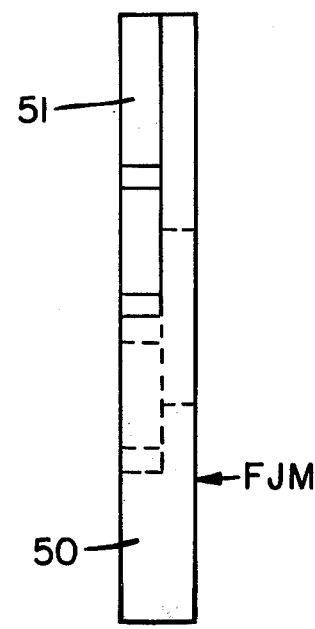
Fig. 6a
Fig. 6b
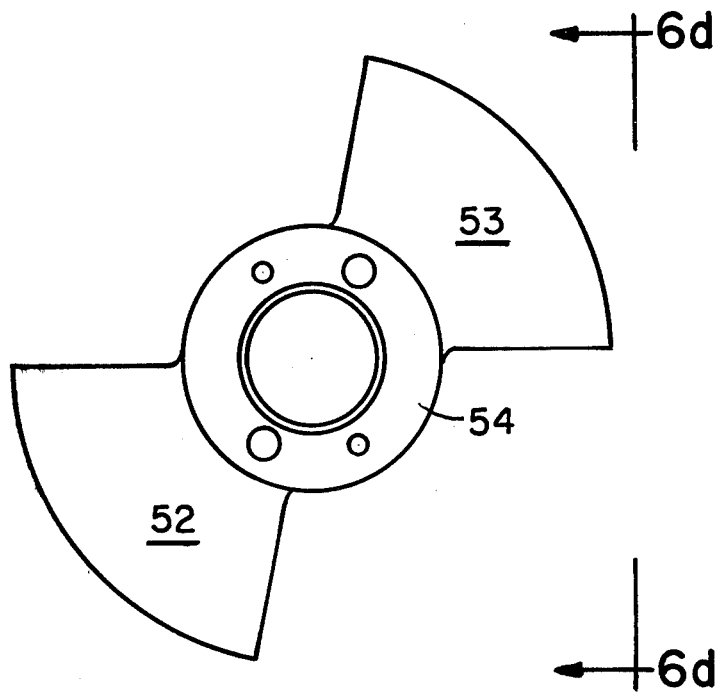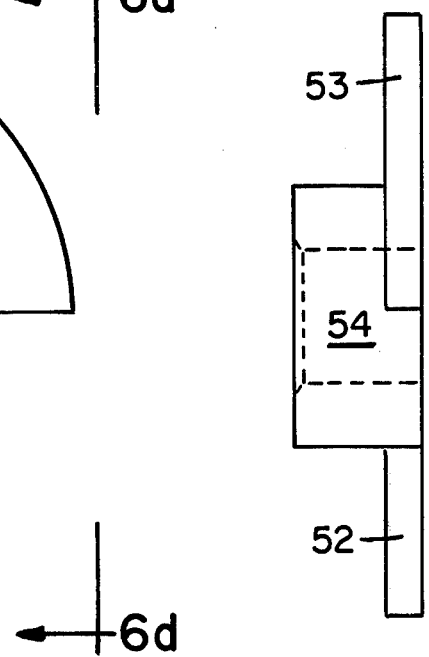
Fig. 6c
Fig. 6d

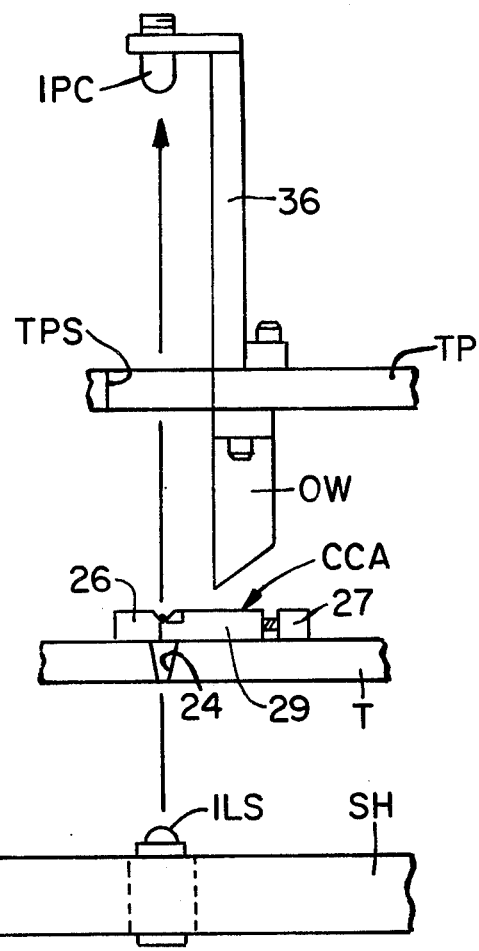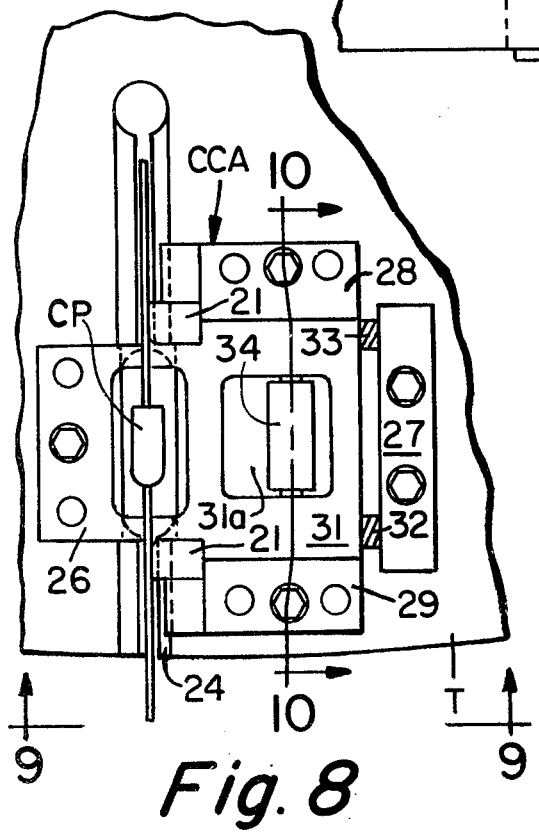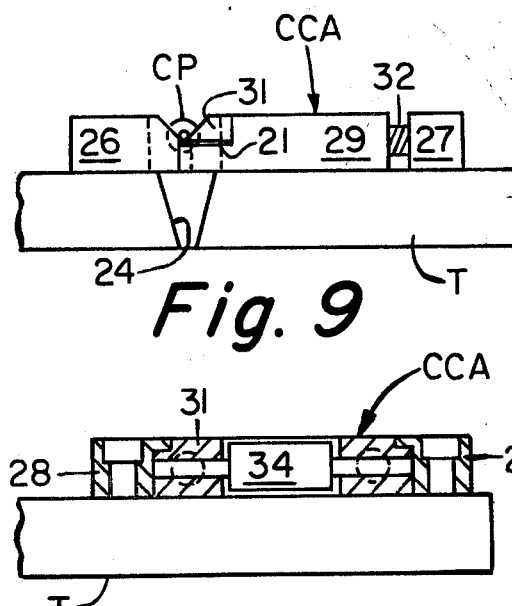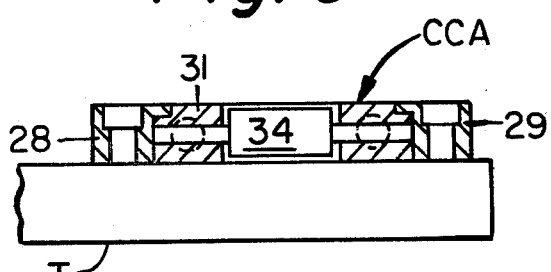

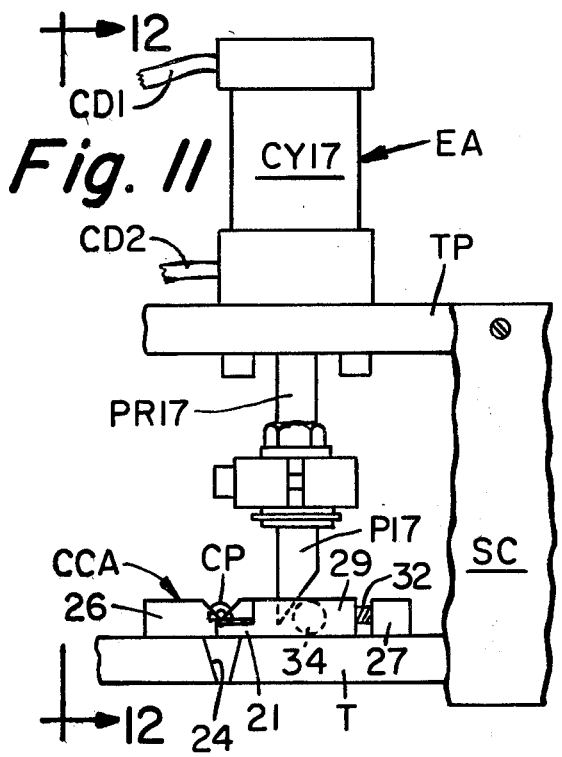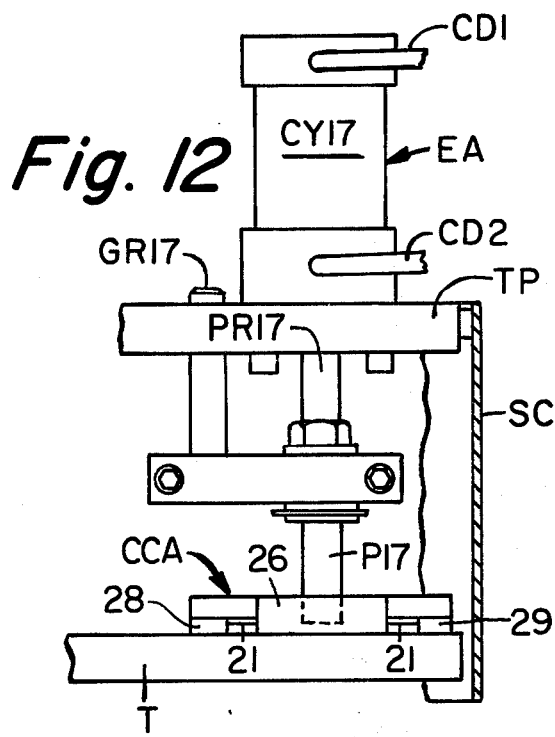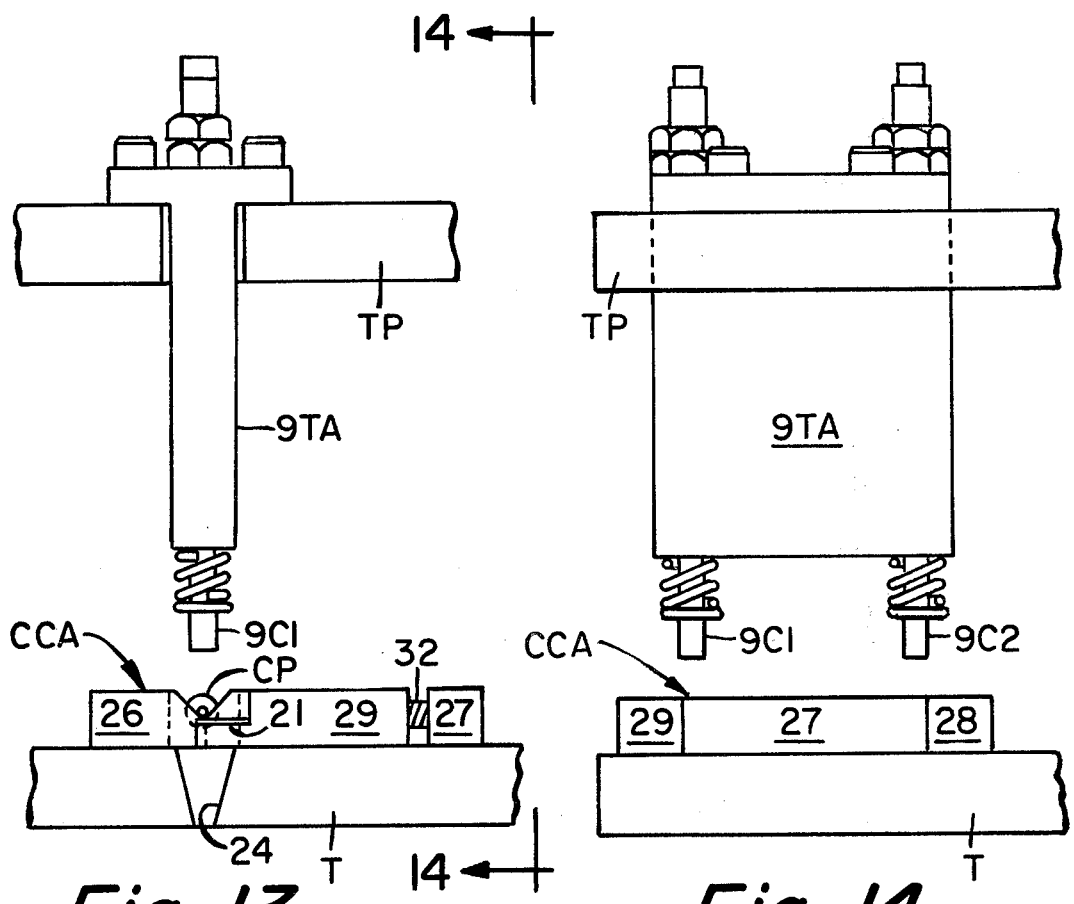

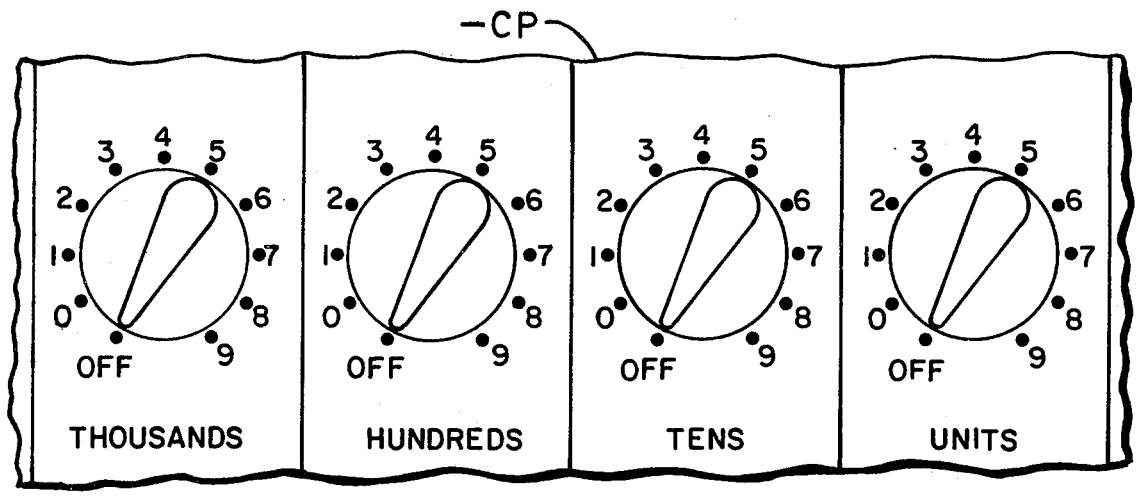
Fig. 27
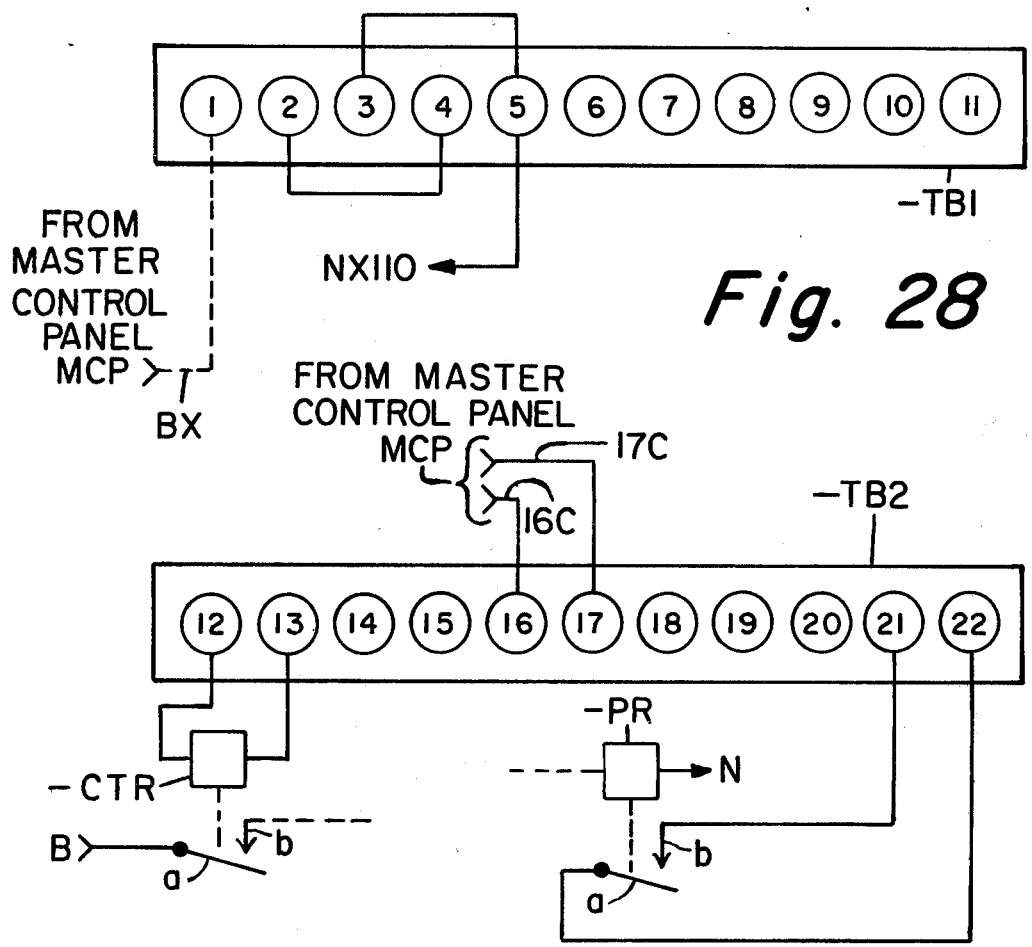
Fig. 28
Fig. 29

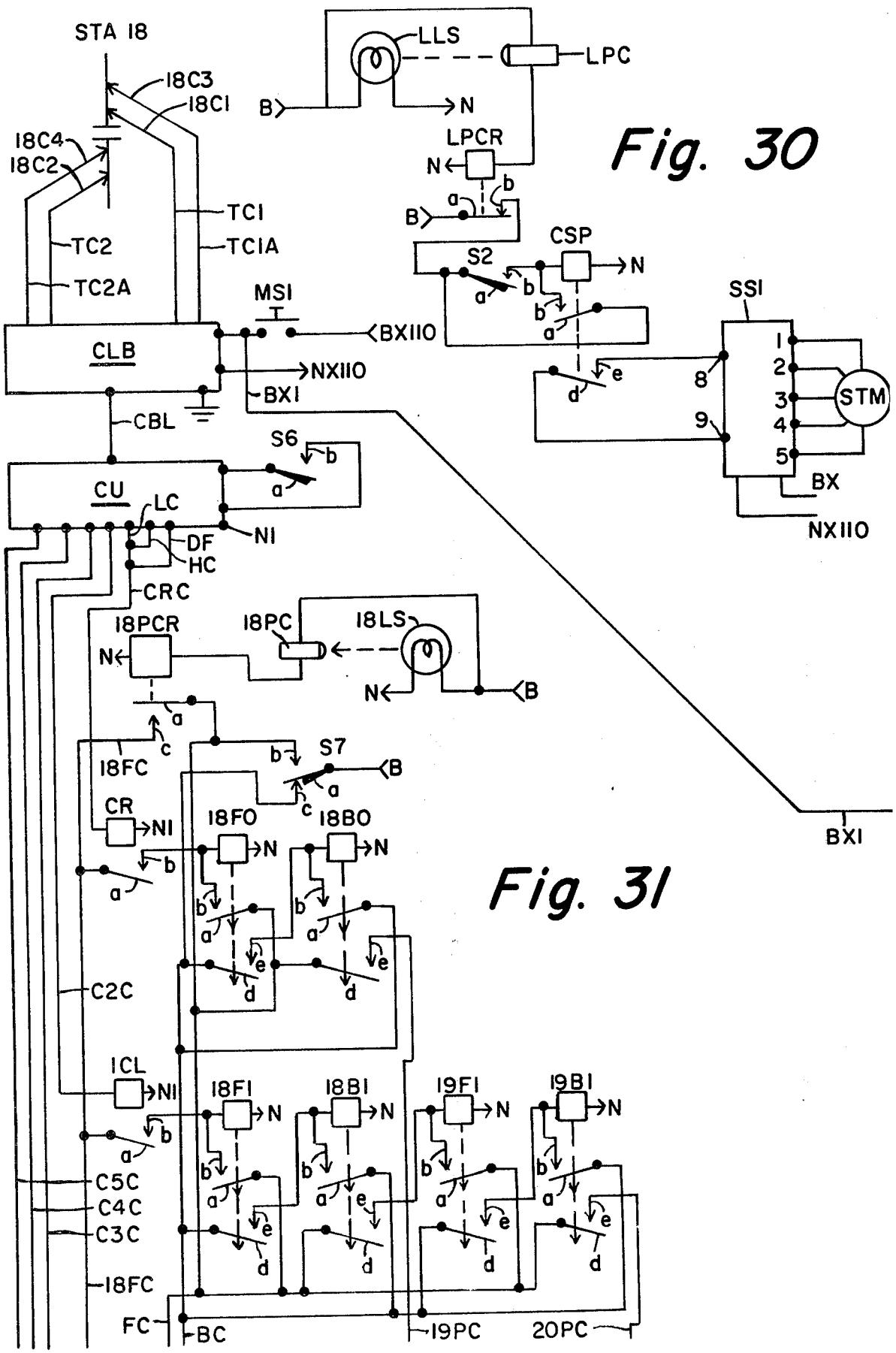

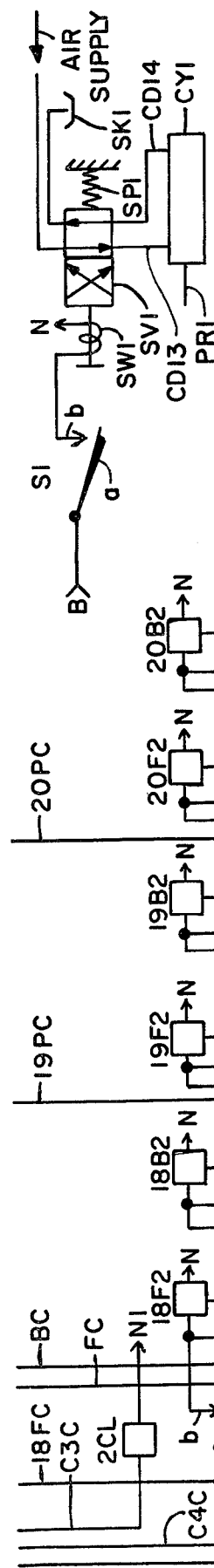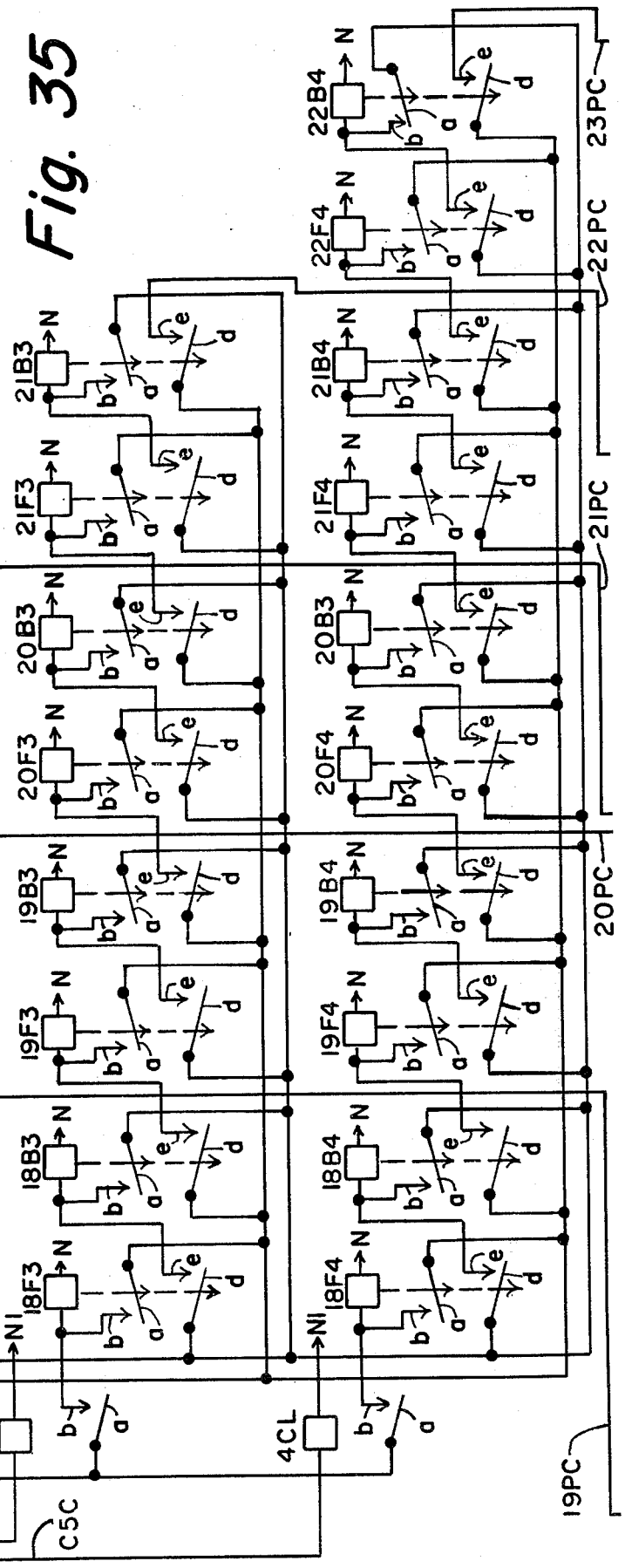
Fig. 34
Fig. 35

3,930,993

CAPACITOR TESTING AND SORTING APPARATUS

BACKGROUND OF THE INVENTION

Manually testing direct current leakage and capacitance of capacitors, and sorting the capacitors in accordance with the results of such tests, is relatively time consuming and, therefore, adds substantially to the cost of and the price which must be charged for capacitors which are so tested. Accordingly, it is an object of the present invention to provide an apparatus which will automatically test capacitors, that is, which will test the above mentioned parameters of capacitors and will automatically sort the tested capacitors into selected categories or classifications at a high rate of speed.

It is another object of the present invention to provide an apparatus which can rapidly sort and classify capacitors having desired parameters and supply such classified capacitors to corresponding containers suitable for storage or shipment of each class of capacitor.

Other objects and novel features of the invention will become apparent as the description proceeds.

SUMMARY OF THE INVENTION

The invention is believed to be adequately summarized in the foregoing abstract of the disclosure and, therefore, for the sake of brevity and to prevent repetition or redundancy, no further summary of the invention will be given nor is any considered necessary.

BRIEF DESCRIPTION OF THE DRAWINGS

In the drawings:

FIG. 5 is a cross-sectional detailed view of a part of the apparatus of FIG. 4, such view being on enlarged scale and taken generally along the line 5—5 of FIG. 6;

FIG. 6 is an end view of the apparatus part shown in FIG. 5, such view being taken generally along line 6—6 of FIG. 5;

FIGS. 6a, 6b, 6c and 6d are detail views illustrating the shapes of parts of the apparatus shown in FIG. 6 with FIG. 6b being taken generally along line 6b—6b of FIG. 6a and FIG. 6d being taken generally along line 6d—6d of FIG. 6c;

FIG. 7 is a detail view of a minor part of the apparatus embodying the invention;

FIG. 8 is a detail top plan view of a capacitor clamp assembly employed in the apparatus of the invention, such view illustrating a capacitor clamped in such assembly;

FIG. 9 is an end elevational view of the assembly and capacitor of FIG. 8, such view being taken generally along line 9—9 of FIG. 8;

FIG. 10 is a cross-section view of the assembly of FIG. 9, such view being taken generally along line 10—10 of FIG. 9;

FIG. 11 is an elevational view of a clamp assembly opener used in the apparatus of the invention;

FIG. 12 is an elevational view of the opener of FIG. 11, such view being taken generally along line 12—12 of FIG. 11;

FIG. 13 is an end elevational view of a capacitor lead contactor or contacting device employed in the invention;

FIG. 14 is a side elevational view of the contactor or contacing device of FIG. 13, such view being taken generally along line 14—14 of FIG. 13;

FIG. 27 illustrates a part of a capacitor count selection panel of an electronic counter, several of which are used in the apparatus of the invention;

FIGS. 28 and 29 illustrate first and second terminal boards on one of the electronic counters used in the invention, and certain circuit connections to and interconnections between terminals on each respective board as well as connections to a relay from terminals on the terminal board of FIG. 29;

FIGS. 30 through 37 on drawing sheets 14 through 18, when such sheets are arranged as shown in FIG. 38, comprise a schematic electrical wiring and pneumatic diagram illustrating connections between electric and pneumatic components employed in the apparatus embodying the invention.

Similar reference characters refer to similar parts in each of the FIGS. of the drawings.

PREFERRED EMBODIMENT OF THE INVENTION

Figure 1:
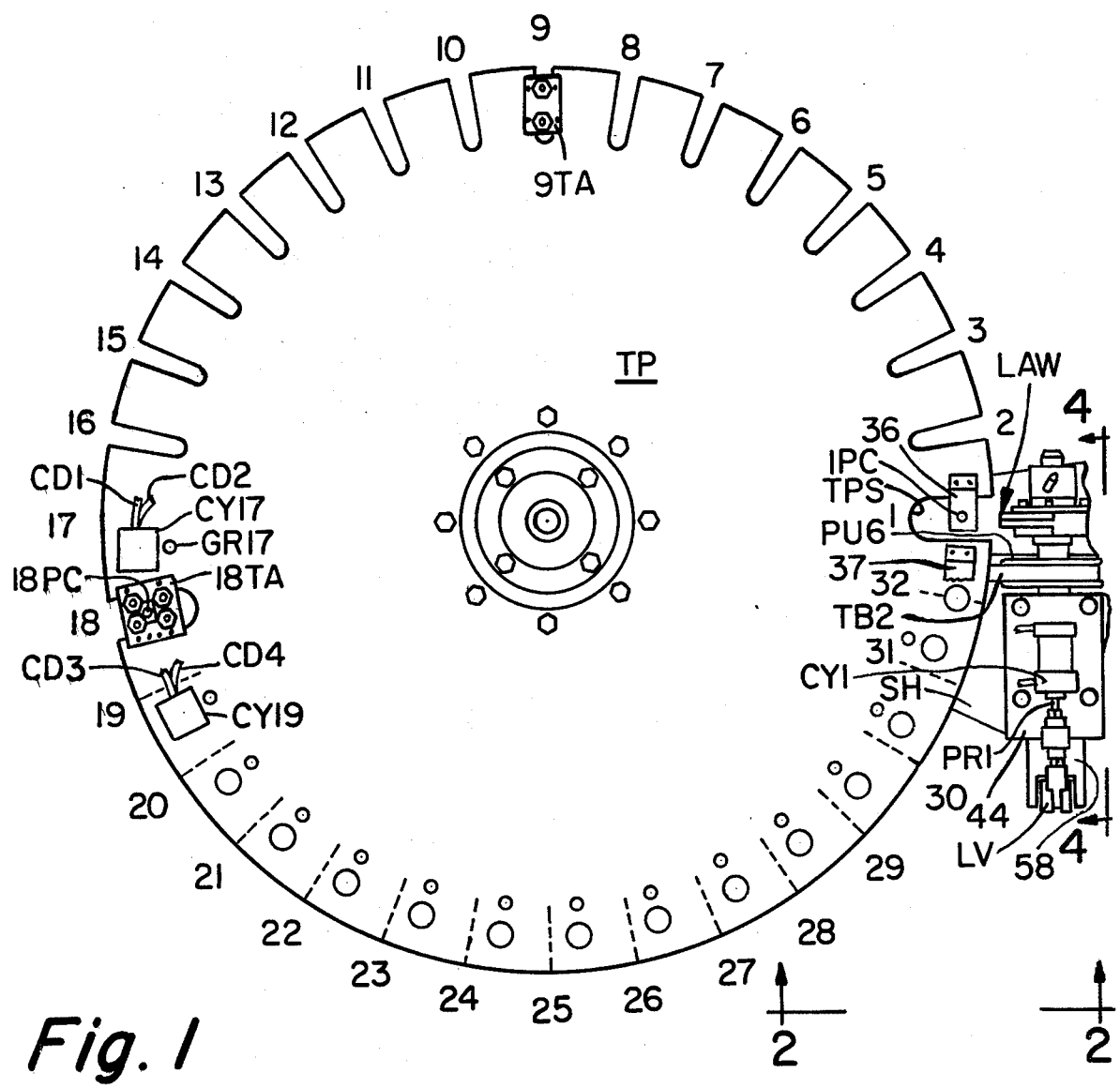
FIG. 1 is a top plan view of a part of the apparatus embodying the invention.
Figure 38:
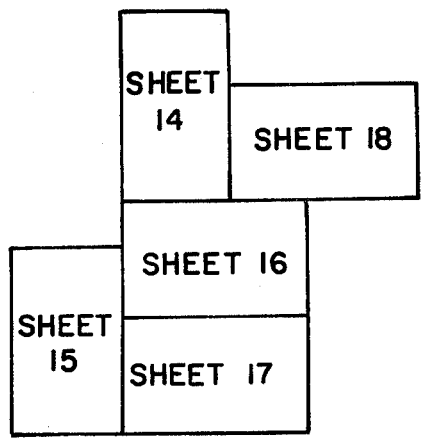

Referring to FIGS. 1 through 4 of the drawings in detail, there is shown a vertically reciprocative circular top or tool plate TP having a plurality of safety covers such as SC provided about the periphery thereof, and such tool plate being located above a circular rotatable turret T (FIG. 2) which is movable or rotatable between a plurality of equally spaced apart stations in a circular path of travel. Such stations are shown in FIG. 1 as comprising 32 successive stations numbered from 1 to 32 and including a capacitor receiving station (station 1 in FIG. 1) located adjacent a capacitor loading or delivery station to be discussed hereinafter, and, moving counterclockwise about tool plate TP, a sequence or succession of twelve stations for supplying direct current electrical charges across the axial leads of capacitors having such leads stations 2 through 13 in FIG. 1); a station for testing the direct current leakage of each said capacitor (station 14 in FIG. 1); two successive stations for electrically discharging the charged capacitors (stations 15 and 16 in FIG. 1); a first reject station for rejecting capacitors which fail or do not have suitable leakage characteristics (station 17 in FIG. 1); a station for testing the capacitance and dissipation factor of each said capacitor (station 18 in FIG. 1); a second reject station for rejecting capacitors which do not have suitable capacitance or dissipation factor characteristics (station 19 in FIG. 1); and a succession of stations for sorting acceptable capacitors in accordance with one of four capacitance classifications or categories associated with each respective capacitor at said capacitance test station 18, such succession of stations comprising stations 20 through 23 in the embodiment of the invention herein disclosed. The remaining stations 24 through 31 shown in FIG. 1 are spare stations and station 32 is a station for detecting any capacitor or capacitors which inadvertently are not rejected or sorted out at one of the reject or sorting stations, such detection of such a capacitor interrupting the operation of the apparatus until the detected capacitor is removed therefrom. It is pointed out that, in actuality, the apparatus of the invention is capable of sorting acceptable capacitors into more than four classifications or categories and, in such case, each next succeeding spare station would be used as a sorting station for each next additional classification or category into which the respective capacitors are to be sorted. It is also pointed out, as is believed readily apparent, that a succession of less or more than 32 equally spaced apart stations could be employed with or in the apparatus of the invention if so desired.

Referring further to FIG. 1, taken in conjunction with FIGS. 13 and 14, there is shown at arbitrarily selected station 9 of tool plate TP a capacitor lead contacting assembly or device 9TA which supports a pair of lead contactors or probes 9C1 and 9C2 (FIG. 14) which are spring biased to lowered positions and are actuable upwardly against said spring biasing when tool plate TP is actuated to its lowered position and the lower ends of the probes or contactors 9C1 and 9C2 contact the leads of a capacitor such as CP (FIG. 13) carried by a clamping assembly CCA mounted on the upper surface of turret T and to be hereinafter discussed in detail in conjunction with FIGS. 8, 9 and 10 of the drawings. The upper ends of probes or contactors 9C1 and 9C2 are provided with suitable nuts for the purpose of making electrical connections to the respective terminals as further discussed hereinafter. As mentioned above, station 9 has been arbitrarily selected for the purpose of illustrating the mounting of a contactor device such as 9TA on tool plate TP and the structure of such device. In actuality there is one such contactor device mounted on tool plate TP for each of the stations 2 through 13 of FIG. 1, such contactor devices other than at station 9 being omitted from FIG. 1 of the drawings for purposes of simplification of such drawing FIG.

Figure 15:
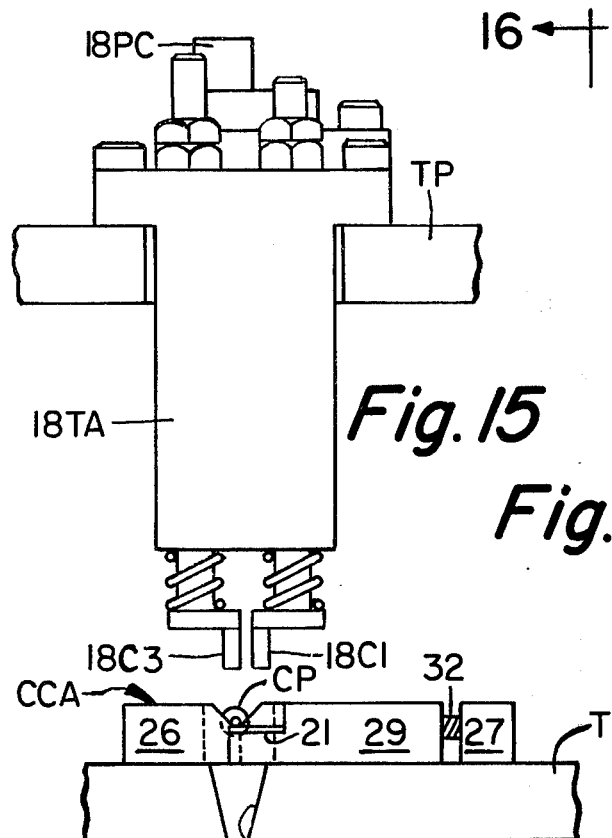
FIG. 15 is an end elevational view of another type of capacitor lead contactor or contacting device employed in the invention.
Figure 16:
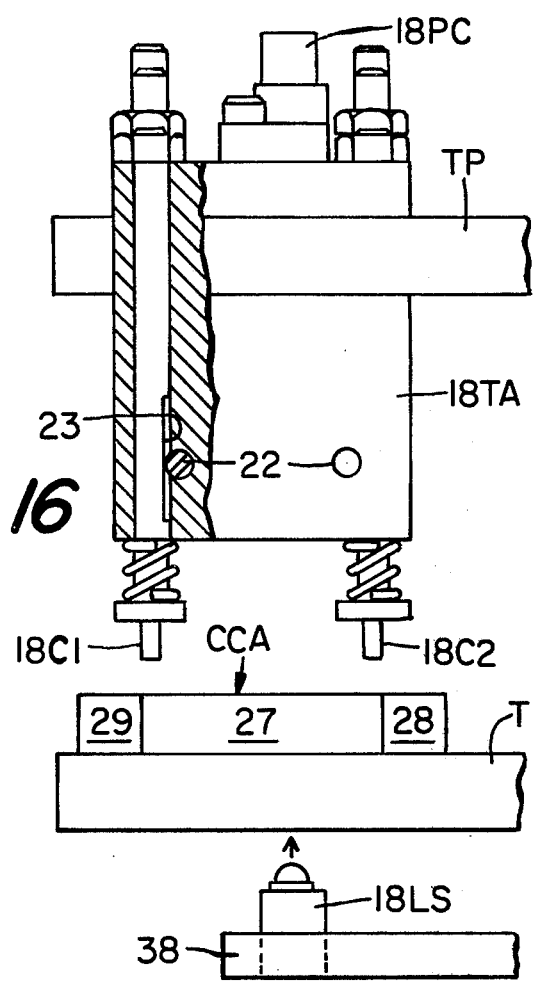
FIG. 16 is a side elevational view of the contactor or contacting device of FIG. 15, such view being taken generally along line 16—16 of FIG. 15.

Referring now to FIG. 1 taken in conjunction with FIGS. 15 and 16, there is shown at station 18 of tool plate TP a capacitor lead contacting assembly or device 18TA which supports a first pair of associated lead contactors or probes such as 18C1 and 18C3, and a second pair of associated probes or contactors 18C2 and 18C4, the latter not appearing in FIGS. 15 and 16 of the drawings but the arrangement of which will be readily apparent from the arrangement of contactors 18C1 and 18C3 in FIG. 15. Said probes or contactors such as 18C1, 18C2 and 18C3 are spring biased to lowered positions and are actuated upwardly against the force of the springs of the contactors when tool plate TP is actuated to its lower position and the ends of said contactors are pressed downwardly against the leads of a capacitor such as CP carried in a clamping assembly such as CCA mounted on the upper surface of turret T or downwardly against small electrically conductive plates 21 of an assembly such as CCA, such conductive plates being hereinafter discussed in more detail in conjunction with FIGS. 8, 9 and 10 as previously mentioned. The probes or contactors such as 18C1, 18C2 and 18C3 are provided on their upper ends with nuts for making electrical connections thereto as hereinafter further mentioned. It is pointed out that said probes or contactors are prevented from rotational movement by pins such as (FIG. 16) extending through the body of contacting assembly 18TA and bearing against flats or flat portions such as 23 provided on the outer periphery of each of the contactors as illustrated in FIG. 16.

There is provided adjacent stations 17 and 19 of the apparatus, clamping assembly openers or opening devices EA including pressurized fluid cylinders CY17 and CY19, respectively, (FIG. 1). The structure of cylinder CY17 and its associated apparatus is illustrated in detail in FIGS. 11 and 12, and such cylinder includes the usual piston rod such as PR17, which has clamped thereto a vertical guide rod GR17, such piston rod carrying on the lower end thereof a clamping assembly opening pin P17 whose lower wedge shaped end actuates a clamping assembly or device such as CCA to an open or capacitor lead unclamping condition when tool plate TP is in its lower position and pressurized fluid is supplied over a conduit CD1 to the upper end of cylinder CY17 to actuate piston rod PR17 and pin P17 downwardly as illustrated in FIGS. 11 and 12. Such actuation of pin P17 and the resultant opening of an assembly or device such as CCA unclamps or releases a capacitor such as CP to permit it to fall through an associated downwardly tapered radially extending slot such as 24 in turret T, as will be discussed further hereinafter. Following a downward actuation of piston rod PR17 and its associated pin P17, and the release of a capacitor such as mentioned, pressurized fluid is supplied over a conduit CD2 to the lower end of cylinder CY17 to actuate piston rod PR17 and pin P17 upwardly to remove the lower wedge shaped end of such pin from the clamping assembly such as CCA and permit it to return to an unactuated clamping condition as discussed in more detail hereinafter. The structure and method of actuation of cylinder CY19 shown at station 19 in FIG. 1 is the same as that of cylinder CY17 and reference is made to FIGS. 11 and 12 if details of the structure of CY19 and its associated apparatus is desired. It is pointed out however that pressurized fluid conduits CD3 and CD4 are shown in FIG. 1 as connecting with the upper and lower ends, respectively, of cylinder CY19, such conduits corresponding respectively to conduits CD1 and CD2 connected to cylinder CY17.

At each of the stations 21 through 23 shown in FIG. 1 there is provided a pressurized fluid cylinder and associated parts similar to above discussed cylinders CY17 and CY19 shown at stations 17 and 19, respectively. However, for purposes of simplication of FIG. 1, only cylinders CY17 and CY19 are shown therein. The cylinders at stations 20 through 23 and the respectfully associated pressurized fluid conduits connected thereto are shown schematically in FIG. 36 of the drawings along with cylinder CY19 and such cylinders and their actuation will be discussed hereinafter in an operational example of the invention.

Referring now to FIGS. 8, 9 and 10, one of the previously mentioned capacitor lead clamping assemblies CCA is shown in detail in such drawing FIGS. Such assembly includes first and second fixed block members 26 and 27 which are secured to the top surface of turret T, a pair of slide guide members 28 and 29 also affixed to the top surface of turret T and a slide member 31 itself which is slidably movable a small distance between guide members 28 and 29. A pair of springs 32 and 33 normally spring bias slide member 31 to a closed or clamping condition of the clamping assembly as shown in FIGS. 8 and 9, portions of the left hand end (viewing FIGS. 8 and 9) of slide member 31 contacting the leads of a capacitor such as CP and pressing such leads against portions of the right hand end (also viewing in FIGS. 8 and 9) of block member 26 at such time to clamp the capacitor such as CP in the clamping assembly CCA. Slide member 31 and block member 26 have central cut-out portions for accommodating the body of a capacitor such as CP whose leads are clamped in the clamping assembly. Slide member 31 further includes an opening 31a extending downwardly therethrough and there is rotatably supported in such opening a roller such as 34 which is contacted and actuated by the pin such as P17 of a clamping assembly opener such as EA previously discussed to thereby open a clamping assembly such as CCA. It will be noted that the leads of a capacitor such as CP clamped in a clamping assembly such as CCA rest on the previously mentioned electrically conductive plates such as 21 of the clamping assembly.

Referring further to FIG. 8, it is pointed out that there is a plurality of 32 clamping assemblies such as CCA evenly spaced apart about turret T adjacent the outer periphery of such turret and there is located below each such assembly one of the previously mentioned radial slots such as 24 extending downwardly through the turret. Each slot such as 24 has a central portion which is large enough to permit the bodies of the largest capacitors to be tested and sorted by the apparatus of the invention to pass while the inner and outer portions or ends of each said slot are V-shaped or taper downwardly to relatively narrow openings extending through the bottom surface of turret T, such openings being wide enough to accommodate the largest axial leads of the capacitors such as CP, and the slots such as 24 guiding released capacitors downwardly through the bottom of turret T into suitable bins or containers located beneath such turret as hereinafter discussed.

Figure 2:
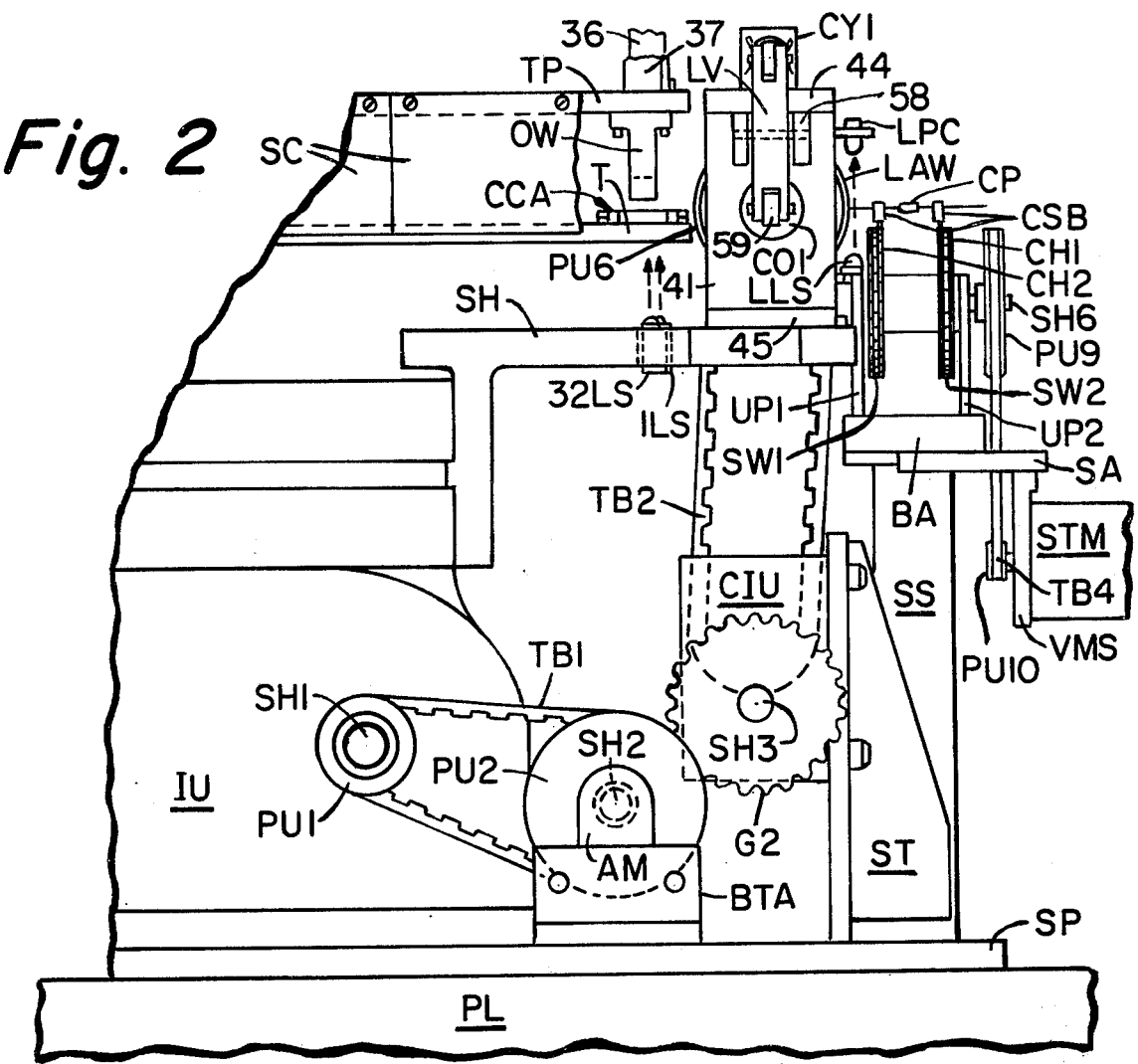
FIG. 2 is an enlarged elevational view taken generally along line 2—2 of FIG. 1 and including other apparatus in conjunction with which the apparatus of the present invention may be employed.
Figure 3:
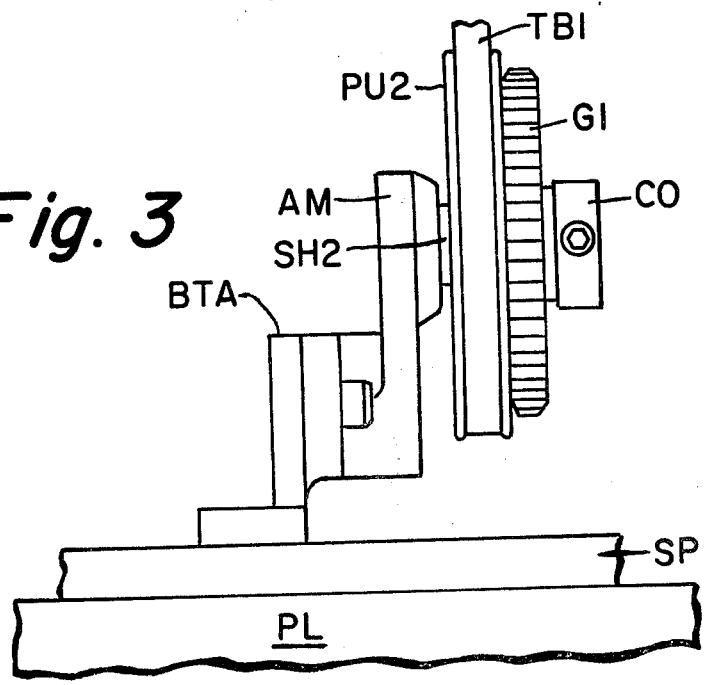
FIG. 3 is a detailed elevational view of a minor part of the apparatus of FIG. 2.
Figure 4:
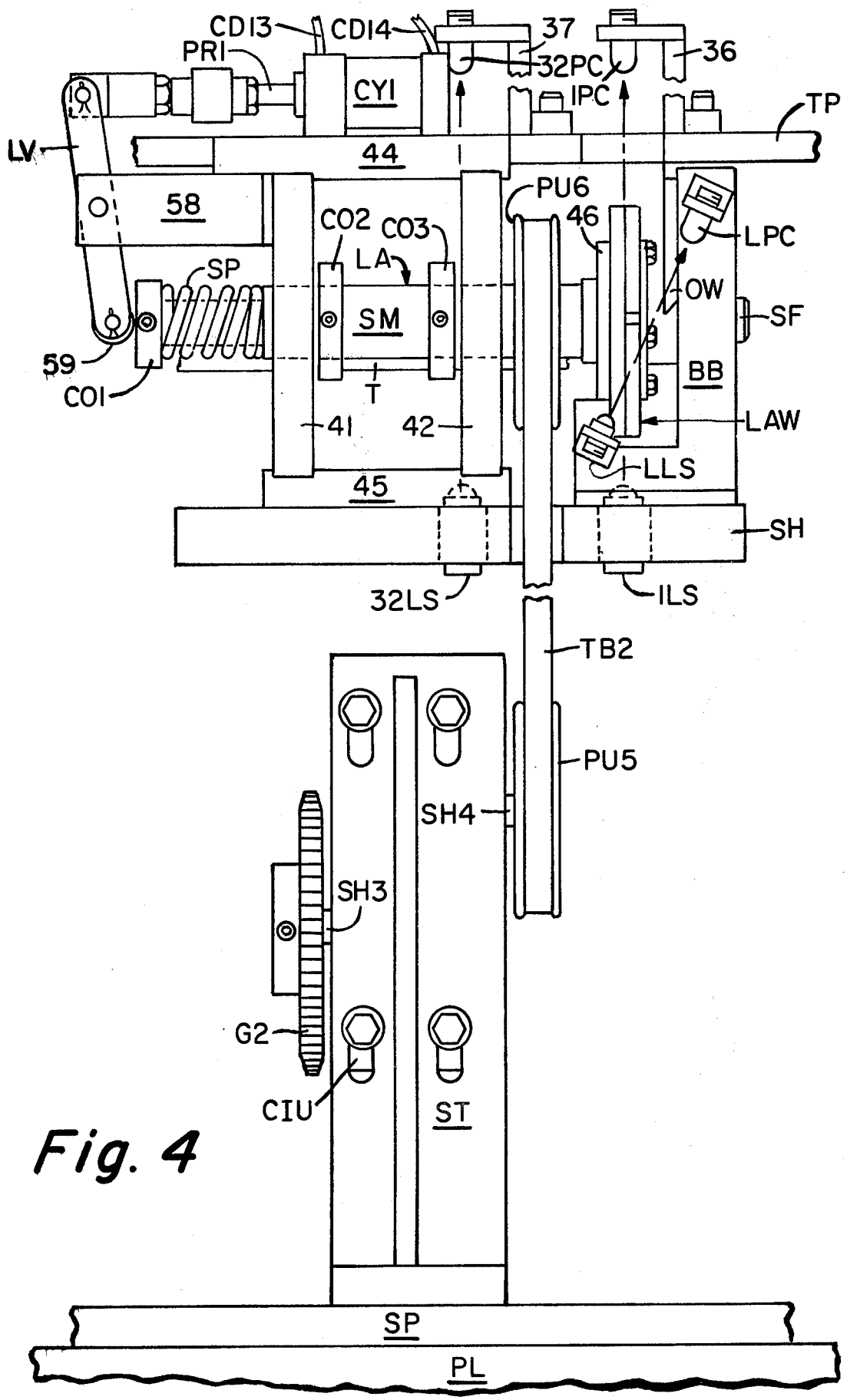
FIG. 4 is an enlarged elevational view of a part of the apparatus of FIGS. 1 and 2, such view being generally taken along line 4—4 of FIG. 1.

Referring now to FIG. 7 taken in conjunction with FIGS. 1, 2 and 4, there is shown a support bracket 36 for a light sensitive device such as photocell 1PC, such bracket being located adjacent the capacitor receiving station or station 1 in FIG. 1 so that the lens of the photocell is disposed over the center of a relatively large slot such as TPS in tool plate TP. A light source 1LS is supported in a suitable hole embodied in a shelf SH located below turret T and when such light source is energized and there is no capacitor in the clamping assembly such as CCA at station 1, that is, at the capacitor receiving station, a light beam from light source 1LS will be projected upwardly to impinge on the lens of photocell 1PC to actuate such device. The purpose of such arrangement will be discussed hereinafter.

There is also shown in FIGS. 2 and 7, attached to the bottom surface of tool plate TP, a clamping assembly opener OW having a wedge shaped lower end and which is actuated upwardly and downwardly by the upward and downward actuations of tool plate TP. Opener OW is attached to tool plate OW so that when tool plate TP is lowered the lower wedge shaped end of opener OW will contact the roller 34 of each clamping assembly such as CCA moved to station 1, that is, to the capacitor receiving station, and press against such roller to open the respective clamping assembly then at such receiving station. It will be noted that there is no safety cover such as SC (FIG. 2) attached to the periphery of tool plate TP in the vicinity of the capacitor receiving station as shown in FIG. 4.

A photocell support bracket such as 37 (FIGS. 1, 2 and 4) supports another photocell 32PC adjacent station 32 (FIG. 1) and the lens of such photocell is located so as to normally receive light from a light source 32LS also supported in a suitable hole in said shelf SH (FIG. 4), a light beam from such light actuating photocell 32PC when there is no capacitor in a clamping assembly such as CCA then at station 32. The purpose of such arrangement will also be discussed hereinafter.

A third light sensitive device such as photocell 18PC is supported by capacitor lead contacting device 18TA at station 18 (FIGS. 1 and 15) and a third light source 18LS is supported in a hole in a suitable bracket 38 disposed beneath turret T at station 18 so that a light beam projected vertically from such light source will impinge on the lens of photocell 18PC and actuate such photocell when a clamping assembly such as CCA is at station 18 and there is no capacitor in such clamping assembly. The purpose of the photocell arrangement at station 18 will be pointed out hereinafter.

Referring to FIG. 2 of the drawings, there is shown an indexing or drive unit IU which is attached to the top of a support plate SP resting on a suitable platform PL. Such index unit drives or moves tool plate TP, turret T and other parts of the apparatus as hereinafter pointed out. Indexing unit 10 is of a type which will provide intermittent or periodic rotational movement to turret T and vertically reciprocative or up and down motion to tool plate TP when the electric motor drive included with such unit is energized as hereinafter discussed in detail. Indexing units such as IU are well known in the art and such unit may, for example, be a "Series B" Turret Indexing Unit which may be obtained from Swanson-Erie Corporation whose address is 814 East Eighth Street, Erie, Pa. Such unit is arranged to index or move a turret such as T through a 11.25° arc of rotation during each periodic indexing of the unit, there being, of course, 32 such indexing movements in one complete revolution of the turret. The movements of turret T and of tool plate TP by index unit IU will be discussed in detail hereinafter in conjunction with FIGS. 25 and 26 of the drawings.

Figure 25:
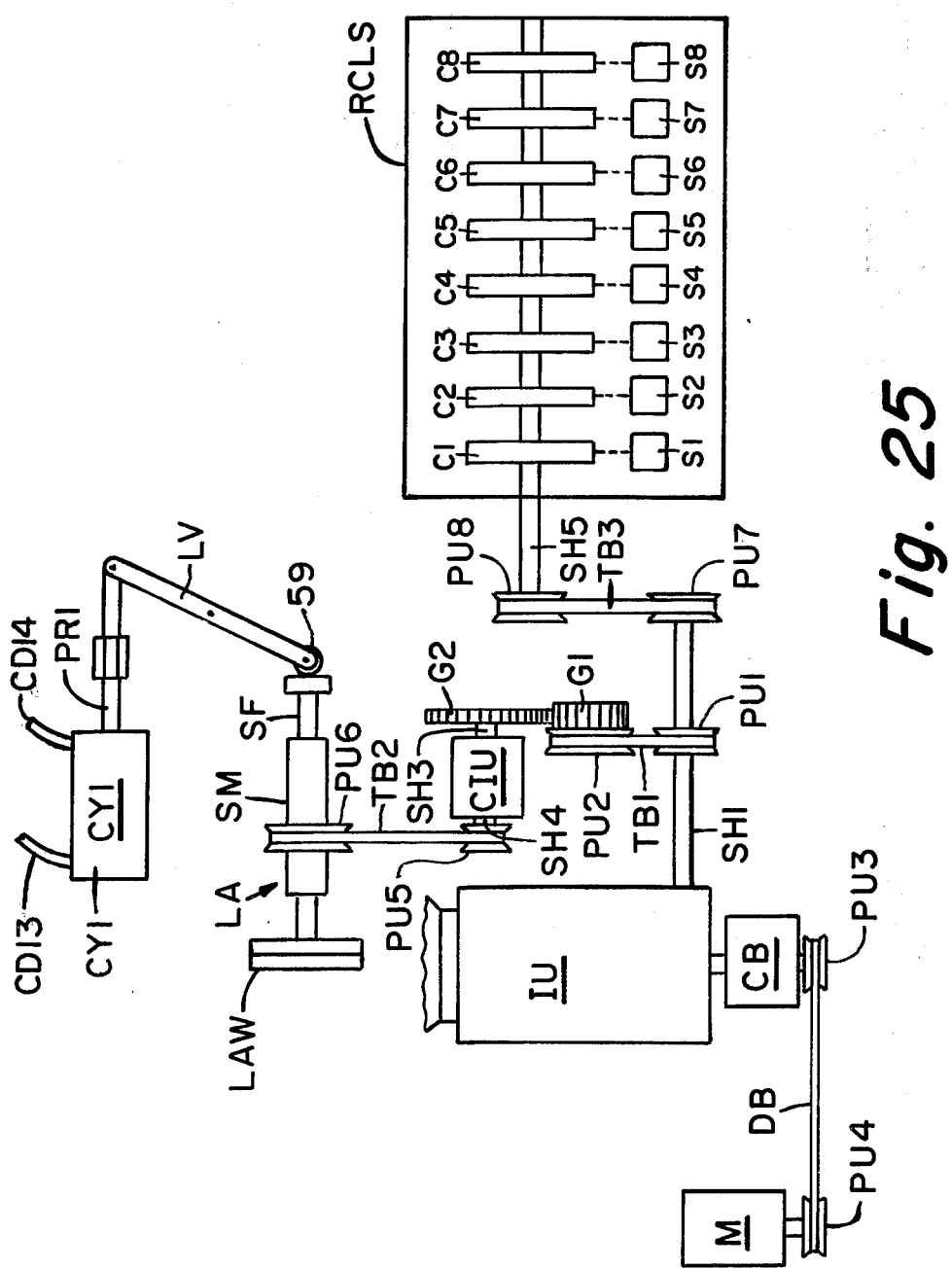
FIG. 25 is a schematic illustration of certain mechanical parts of the invention and mechanical interconnections between such parts.

Referring again to FIG. 2 taken in conjunction with FIG. 25, index unit IU has keyed to an output shaft SH1 thereof and for rotation therewith a first toothed pulley PU1 about whose outer periphery there is looped a first toothed timing belt TB1 which also loops about the outer periphery of a toothed pulley PU2 (FIG. 3) rotatably supported on a belt tension adjustment device BTA secured to the top of support platform SP and including an adjustable arm AM which supports a short stationary shaft SH2 upon which pulley PU2 rotates. There is secured to the outer face of pulley PU2, for rotation therewith, a first toothed gear G1 whose teeth mesh with a scond toothed gear G2 (see also FIG. 4) which is keyed to the input shaft of a small index unit CIU which is attached to a stand ST having a foot portion secured to the top of support platform SP. Index unit CIU is further discussed below. Pulley PU2 and gear G1 are held on shaft SH2 by suitable washers and a collar member CO which is keyed to the outer end of shaft SH2. The output shaft of index unit CIU has keyed thereto for rotation therewith another toothed pulley PU5 about which is looped a toothed timing belt TB2 which also loops about the teeth of another toothed pulley PU6 which is mounted on and is keyed to a rotatable sleeve member SM of a capacitor loading assembly LA for driven rotation of such sleeve member (FIG. 4).

The above-mentioned index unit CIU is a unit which rotates its output shaft SH4 through a 180° arc of rotation for each 360° of rotation of the input shaft SH3 of such unit, such output shaft SH4 of unit CIU remaining stationary during rotation of said input shaft SH3 through half or 180° of said 360° of rotation of such input shaft. Index units such as CIU are well known in the art and such unit may, for example, be a model 2090, Series 1620 index unit which may be obtained from Cyclo-Index Corporation whose address is P.O. Box 3651, Cleveland, Ohio 44119. Index unit CIU will be discussed further hereinafter in conjunction with FIGS. 25 and 26 of the drawings.

Referring to FIGS. 5 and 6 taken in conjunction with FIGS. 1, 2 and 4, there is shown the above mentioned capacitor loading assembly LA including said sleeve member SM through the hollow of which extends a shaft SF surrounded, adjacent a first end thereof, by a compression spring SP, a first end of which bears against a collar CO1 which is keyed to said first end of the shaft as by a set screw. The second end of spring SP bears against the left hand end (viewing FIG. 4) of sleeve member SM. Sleeve member SM rotatably extends through a pair of vertical support members 41 and 42 which are secured at their upper and lower ends to horizontal support members 44 and 45, respectively, such lower support 45 being secured to the top surface of previously mentioned shelf SH. Sleeve member SM is held against horizontal movement thereof within said support members by suitable washers and a pair of collars CO2 and CO3 surrounding and keyed to sleeve member SM. Referring to FIG. 5, it will be seen that shaft SF and sleeve member SM are keyed to each other by a key member KM whose inner side extends into a suitable recess 43 provided in the outer periphery of shaft SH. By such arrangement sleeve member SM and shaft SF are rotatable in unison while such shaft is slidably movable a limited distance within the hollow of sleeve member SM.

Sleeve member SM has a flange member 46 secured thereto adjacent the right hand end (viewing FIG. 4) of the sleeve member such as by being welded thereto. There is secured to such flange member 46 a circular fixed jaw member FJM of a capacitor loading assembly wheel LAW which is shown assembled in FIGS. 5 and 6 and includes such fixed jaw member, a movable jaw member MJM, a sleeve-like cam member CM and an annular retaining plate ARP. The shape of fixed jaw member is shown in FIGS. 6a and 6b and it will be noted that such member includes opposite jaw portions 50 and 51 each having a generally planar arcuate configuration of a 90° a sector of a circle, and similar 90° arcuate cutouts between such jaw portions 50 and 51 and in which opposite jaw portions 52 and 53 of said movable jaw member MJM (FIGS. 6c and 6d) are disposed when loading assembly wheel LAW is assembled as shown in FIGS. 5 and 6. It is pointed out that each of the jaw portions 52 and 53 of member MJM have generally planar arcuate configurations of approximately 80° sectors of a circle and the inner ends of such jaw portions connect with a central hub portion 54 of member MJM. Such arrangement permits about 10° rotation of member MJM relative to member FJM when such members are assembled as shown in FIG. 6. Jaw portions 52 and 53 of member MJM are, therefore, rotatable about 10° within the above mentioned cutouts of fixed jaw member FJM.

Referring to FIG. 5, sleeve-like cam member CM embodies a pair of opposite and similar sloping arcuate sltos such as 56 extending through such cam member at opposite locations on the periphery of the cam member. A pin 57 fits tightly through a hole provided in shaft SF and opposite ends of such pin extend snugly but slidably movable into said slots such as 56 in cam member CM. Cam member CM is secured to movable jaw member MJM and the aforesaid annular retaining plate ARP retains arcuate portions 52 and 53 of member MJM snugly but rotatably movable within said arcuate cutouts of fixed jaw member FJM for about a 10° arc of rotation, that is, for an arc of rotation equal to the difference in the 80° arcuate sectors of portions 52 and 53, and the 90° arcuate section of said cutouts. By the arrangement just discussed it will be apparent that when shaft SF is moved longitudinally through the hollow of sleeve member SM, pin 57 in such shaft moves in the slots such as 56 in cam member CM and imparts a limited amount of rotational movement to such cam member relative to sleeve member SM. This, of course, causes rotational movement of movable jaw member MJM relative to fixed jaw member FJM, and rotational movement of portions 52 and 53 of member MJM in the cutouts of member FJM, that is to say, the opening and closing of the jaws of loading assembly wheel LAW of loading assembly LA.

There is attached to the upper surface of horizontal support member 44 (FIGS. 1, 2 and 4) a pressurized fluid cylinder CY1 whose association piston rod PR1 is pivotally attached through suitable linkage devices to the upper end of a lever LV which is pivotally supported at about the center thereof by a clevis member or bracket 58 and whose lower end pivotally carries a roller or wheel 59 whose outer periphery is in contact with and bears against the left hand end of shaft SF (viewing FIG. 4) of capacitor loading assembly LA. said piston rod PR1 of cylinder CY1 is shown in FIG. 4 as being extended to actuate the upper end of lever LV to the left and the lower end of such lever to the right to move shaft SF in a corresponding direction, such actuation of lever LV causing compression of spring SP at such time. Such an actuation of lever LV occurs when pressurized fluid from a suitable source thereof is supplied through a conduit CD14 (FIG. 4) to the right hand end of cylinder CY1 while conduit CD13, connected to the left hand end of cylinder CY1 is connected to a pressurized fluid sink. The above mentioned movement of shaft SF to the right actuates the jaws of loading assembly wheel LAW to an open condition such as shown in FIG. 6. When the above mentioned pressurized fluid supplied to conduit CD14 (FIG. 4) is terminated and such conduit is connected to the aforementioned fluid sink while conduit CD13 is connected to said pressurized fluid source, piston rod PR1 is actuated to move the upper end of lever LV to the right. This removes the force previously supplied to shaft SF by the roller or wheel 59 on the lower end of lever LV and spring SP then moves shaft SF in the left hand direction to cause closure of the previously opened jaws of loading assembly wheel LAW of assembly LA. This will be further discussed hereinafter in conjunction with FIG. 26 of the drawings.

Figure 17:
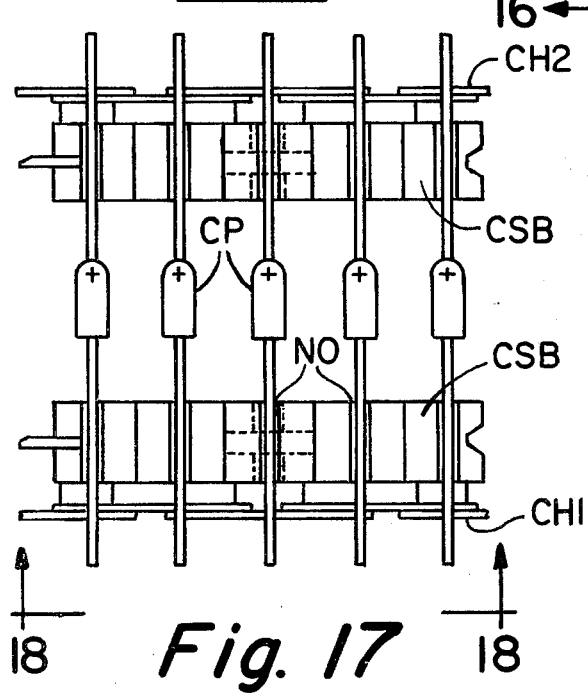
FIG. 17 is a top plan view of several links of lengths of chains used in the previously mentioned other apparatus in conjunction with which the apparatus of the present invention may be employed, such view also illustrating a succession of capacitors carried by fixtures carried by such chains.
Figure 18:
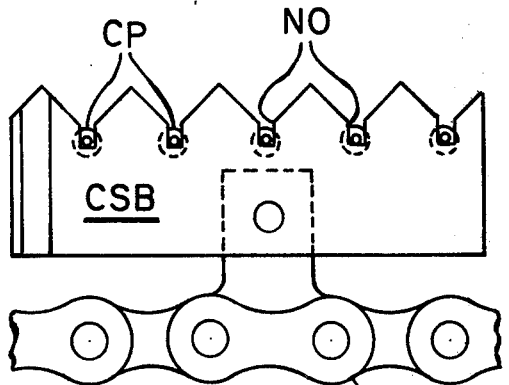
FIG. 18 is an elevational view of the chain links, fixtures and capacitors of FIG. 17, such view being taken generally along line 18—18 of FIG. 17.

Referring now to FIGS. 17 and 18 taken in conjunction with FIG. 2 there is shown short sections of looped capacitor conveyor link chains CH1 and CH2 each of which carry a succession of capacitor support blocks or attachments such as CSB used for transporting capacitors such as CP to the apparatus of the present invention. Link chains CH1 and CH2 loop about suitable spaced apart sprockets or sprocket wheels SW1 and SW2, which are keyed to a shaft SH6 for driven rotation therewith, and about a pair of similar but idler sprockets or sprocket wheels which are not shown in the drawings for the purpose of simplification thereof and because the conveyor chains, such as CH1 and CH2, the sprockets or sprocket wheels such as SW1 and SW2, the chain attachments such as CSB etc. are not, per se, part of the present invention, such parts being shown therein only to the extent necessary to an understanding of the operation of the apparatus of the invention.

Referring further to FIG. 2, said sprockets SW1 and SW2 are keyed to the aforesaid shaft SH6 which is rotatably supported by uprights UP1 and UP2 secured to a suitable base BA which is supported on the upper end of a vertical or upright support stand SS. Base BA has secured to the bottom surface thereof an extending support arm SA to the bottom of which is affixed a vertical motor support VMS which supports a stepping motor STM hereinafter further discussed. There is keyed to the output shaft of motor STM a toothed pulley PU10 about which loops a toothed gear belt TB4 which also loops about a toothed pulley PU9 keyed to the aforesaid shaft SH6 for driven rotation thereof and of said sprockets or sprocket wheels SW1 and SW2. The energization of stepping motor STM and the rotation of said sprocket wheels SW1 and SW2 to drive chains CH1 and CH2 to convey capacitors such as CP to the apparatus of the present invention, will be discussed further hereinafter in conjunction with FIG. 26 of the drawings.

A photosensitive device such as a photocell LPC is mounted on an upright reverse L-shaped support bracket BB (FIG. 4) adjacent the upper end thereof, the lower or base end of such bracket being supported on previously mentioned shelf SH. A light source LLS is mounted on the base end of bracket BB and is positioned so that a light beam emitted from such light source LLS, when such source is energized, will normally impinge on the lens of photocell LPC and cause actuation of such cell as hereinafter discussed. It is pointed out, with reference to FIGS. 2 and 4 of the drawings, that light source LLS and photocell LPC are located and positioned so that said light beam will be intercepted by a lead of each capacitor which is conveyed by the aforesaid chains CH1 and CH2 (see FIG. 2) to the previously mentioned capacitor loading or delivery station adjacent capacitor receiving station 1 of the apparatus of the present invention. Such interruption or interception of said light beam controls the operation of stepping motor STM (FIG. 2) as hereinafter discussed.

Figure 20:
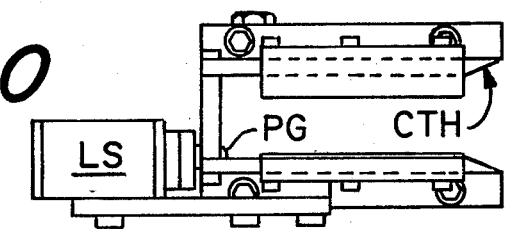
FIG. 20 is a top plan view of the receptacle and limit switch of FIG. 19, such view being taken generally along line 20—20 of FIG. 19.

There is shown attached to the upper surface of support plate SP (FIGS. 19 and 21) beneath turret T, and at each of the sorting stations 20, 21, 22 and 23, a capacitor container holder CTH which comprises a pair of spaced apart vertical side plates 61 and 62 which are separated a distance corresponding to the thickness of a capacitor container such as container CT shown in FIGS. 22, 23 and 24 and to be hereinafter discussed. The holder such as CTH also includes a vertical back plate 63 to which side plates 61 and 62 are secured. The front or right hand inner edges (viewing FIGS. 20 and 21) of a holder such as CTH are beveled to facilitate the ease of insertion of a capacitor container such as CT into such holder and there are cutout sections such as 65 in each side plate of a container holder such as CTH for the purpose of ease of manually grasping of the sides of a container such as CT for removal of such a container from the holder since such a container will fit relatively snugly in the holder. It will be noted that each container holder such as CTH is located at its respective sorting station such as 20, 21, 22 and 23 so that the opening in the top of each respective such holder is disposed below one of the previously mentioned V-shaped or tapered slots such as 24 in turret T when such turret is dwelling so that a capacitor clamping assembly such as CCA is momentarily stopped at the respective sorting station as illustrated in FIGS. 19 and 21.

Figure 19:
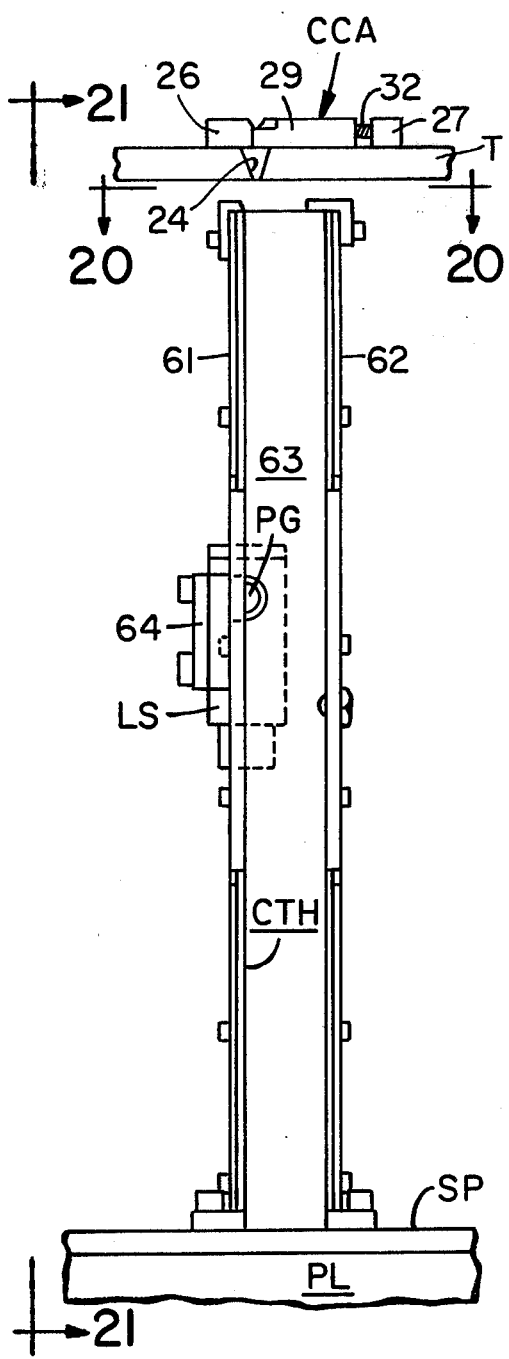
FIG. 19 comprises a front elevational view of an open front receptacle for a capacitor container or package including a limit switch secured thereto and which may be used in the invention disclosed.
Figure 21:
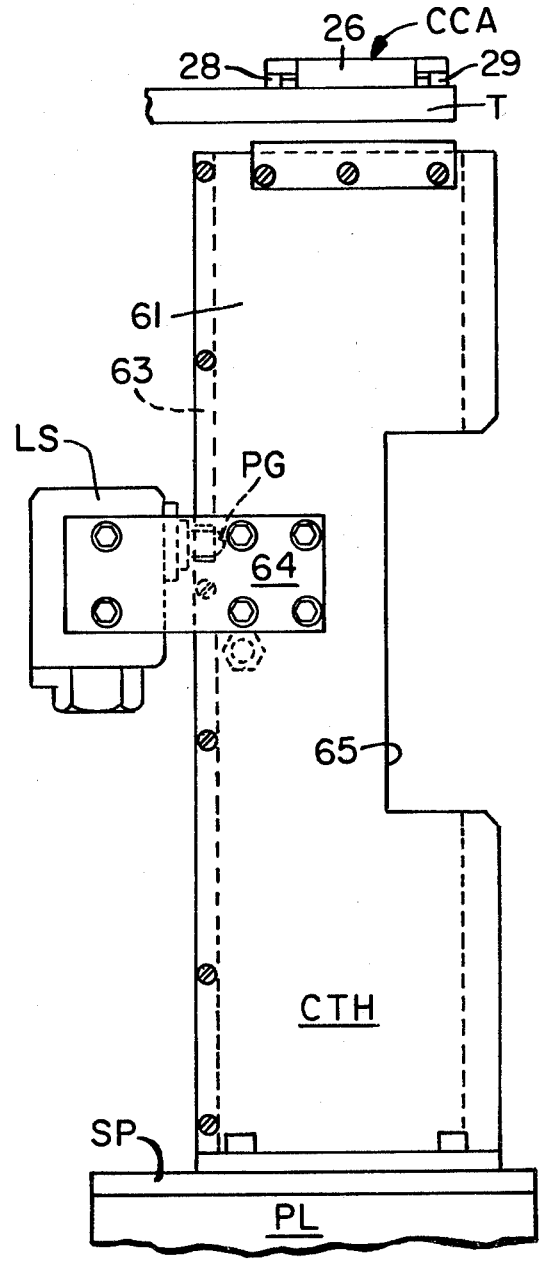
FIG. 21 is a side elevational view of the receptacle and limit switch of FIG. 19, such view being taken generally along line 21—21 of FIG. 19.

A limit switch support bracket 64 is shown secured to the outside of side plate 61 of a container holder such as CTH and a limit switch LS is attached to bracket 64 and is supported thereby with only the semi-spherical end of an actuating plugner PG of the limit switch extending through a cooperative hold 63a provided in back plate 63 and into the interior of a holder such as CTH as illustrated in FIGS. 19 and 21. When a container such as CT (FIGS. 22, 23 and 24) is manually inserted into a holder such as CTH the end of plunger PG is contacted by the back or left hand rear edge of the container and is depressed to actuate limit switch LS to control electrical circuitry hereinafter discussed. Plunger PG of limit switch LS is spring biased to its extended position shown and, when a container is removed from a respective holder such as CTH, the plunger is returned to its undepressed condition to further control electrical circuitry which will be discussed hereinafter in conjunction with FIGS. 33 and 37 of the drawings.

Figure 22:
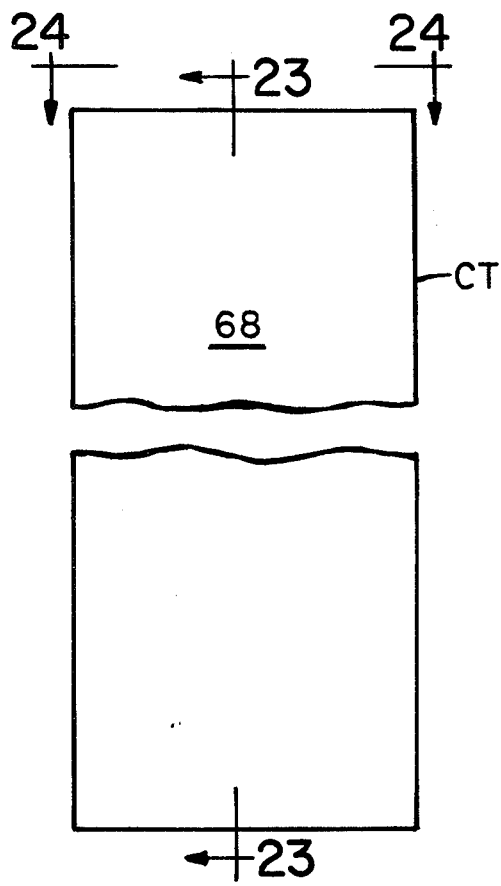
FIG. 22 is a side view of a capacitor container such as may be used in conjunction with a receptacle such as shown in FIGS. 19 through 21.
Figure 23:
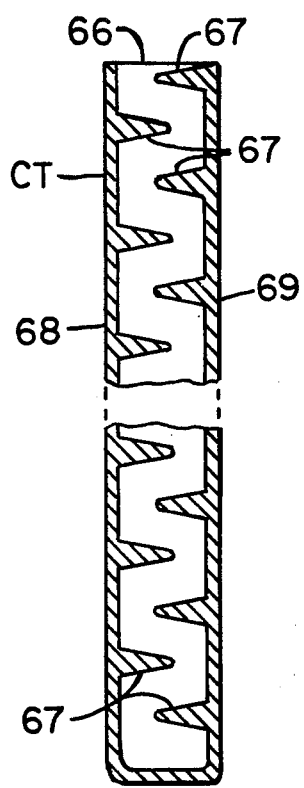
FIG. 23 is a cross-sectional view showing the internal structure of the container of FIG. 22; such view being taken generally along line 23—23 of FIG. 22.
Figure 24:
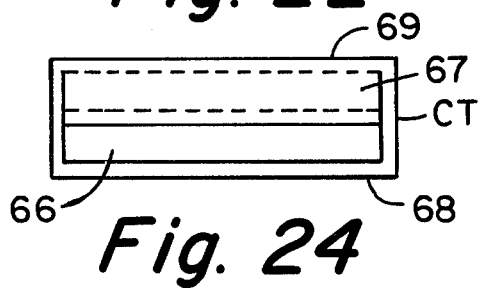
FIG. 24 is a top plan view of the container of FIG. 22, such view being taken generally along line 24—24 of FIG. 22.

The capacitor containers such as CT shown in FIGS. 22, 23 and 24 are of a height and a shape such as to fit relatively precisely within a container holder such as CTH discussed above, and a container such as CT is inserted into each holder such as CTH with the opening 66 in the top of the container to the left, that is, with the left hand side 68 of container CT on the left hand side of holder CTH. That is to say, a container such as CT is inserted into a holder such as CTH so that the upper baffle such as 67 on the interior of the container is at the right hand side 69 of the container as shown in FIG. 23. A container such as CT includes on the interior walls of the sides 68 and 69 thereof a staggered vertical succession of baffles such as 67 shown in FIG. 23 and each container such as CT may, for example, be similar to container 10 shown in copendinig patent application Ser. No. 470,835 which was filed May 17, 1974, now U.S. Pat. No. 3,892,333, and is assigned to the same assignee as the present application, such copending application being entitled Container and Method of Using Same. It is pointed out, however, that the container CT of the present application is taller than the container 10 of said copending application and such container 10 is shown in such copending application in an inverted position for emptying of the container rather than in a position for filling thereof as in the present application.

Referring again to FIG. 25 of the drawings there is shown an electric motor M to whose output shaft these is keyed for rotation therewith a pulley PU4 about which loops a drive belt DB which also loops about a pulley PU3 keyed to the input shaft of an electrically actuated clutch-brake CB for driven rotation thereof and whose output shaft is connected to the input shaft of previously discussed index unit IU for driving of such index unit. When motor M and clutch-brake CB are energized as hereinafter discussed, the input shaft of index unit IU is driven as previously mentioned and, when clutch-brake CB is deenergized, the clutch of such brake is disengaged from the input shaft of index unit IU and the brake of such clutch-brake is actuated to stop further driving of unit IU and bring the unit to a substantially immediate stop, such stopping of the index unit also immediately stopping the apparatus driven from such unit as is readily apparent. Electrically actuated clutch-brakes such as CB are well-known components and such component will be further discussed hereinafter in conjunction with FIG. 33 of the drawings.

Referring further to FIG. 25, there is shown the previously mentioned pressurized fluid cylinder CY1 whose piston rod PR1 is pivotally connected to previously mentioned lever LV for actuation of loading assembly LA as previously discussed. Previously discussed output shaft SH1 of indexing unit IU has keyed thereto for rotation therewith another toothed pulley PU7 about which loops a toothed drive belt TB3 which also loops about a toothed pulley PU8 which is keyed to the input shaft SH5 of a timing drum or rotating can limit switch RCLS for rotation of such shaft and, thereby, of a plurality of rotary cams C1 through C8 of limit switch RCLS and which selectively actuate a series of switches S1 through S8, respectively, to open and close their electrical contacts to open and close electrical circuits during each 360° of rotation of said shaft SH5. Switches S1 through S4, and S6 and S8 each have a pair of contacts which are normally spring biased to an open circuit interrupting condition and each of which are at times actuated to a closed electric circuit closing condition for a respectively selected period of time during each 360° rotation of shaft SH5 and of said cams. Following each respective period of time of closure of the contacts of each of said switches, the spring biasing feature of each respective switch returns the contacts thereof to their open conditions. Switch S5 has a set of three contacts or contact members one of which is a movable contact member which is normally spring biased to a closed condition against a so-called back contact and is actuated by the respectively associated cam C5 to leave such back contact and move to a closed condition against a so-called front contact of the switch for a selected period of time during each rotation of shaft SH5 and of cam C5. Following such period of time of closure against the front contact of switch S5 the spring biasing feature of such switch returns the movable contact member of said set of contacts to its normal position, that is, to a closed position against said back contact of the switch. Switch S7 has a set of three contacts including a movable contact member which is actuated similarly to the movable contact member of switch S5 and, therefore, the actuation of the movable contact member of switch S7 need not be described in detail. Switches S1 through S8 are the same switches that are designated S1 through S8, respectively, in FIG. 26 of the drawings discussed below and which are also shown in various places throughout FIGS. 30 through 37 of the drawings to be hereinafter discussed. Timing drums or rotating cam limit switches such as RCLS are well known components and such switch RCLS may, for example, be an 8-circuit Gemco Rotating Cam Limit Switch which is obtainable from Gemco Electric Company whose address is Clawson, Mich. 48017.

Figure 26:
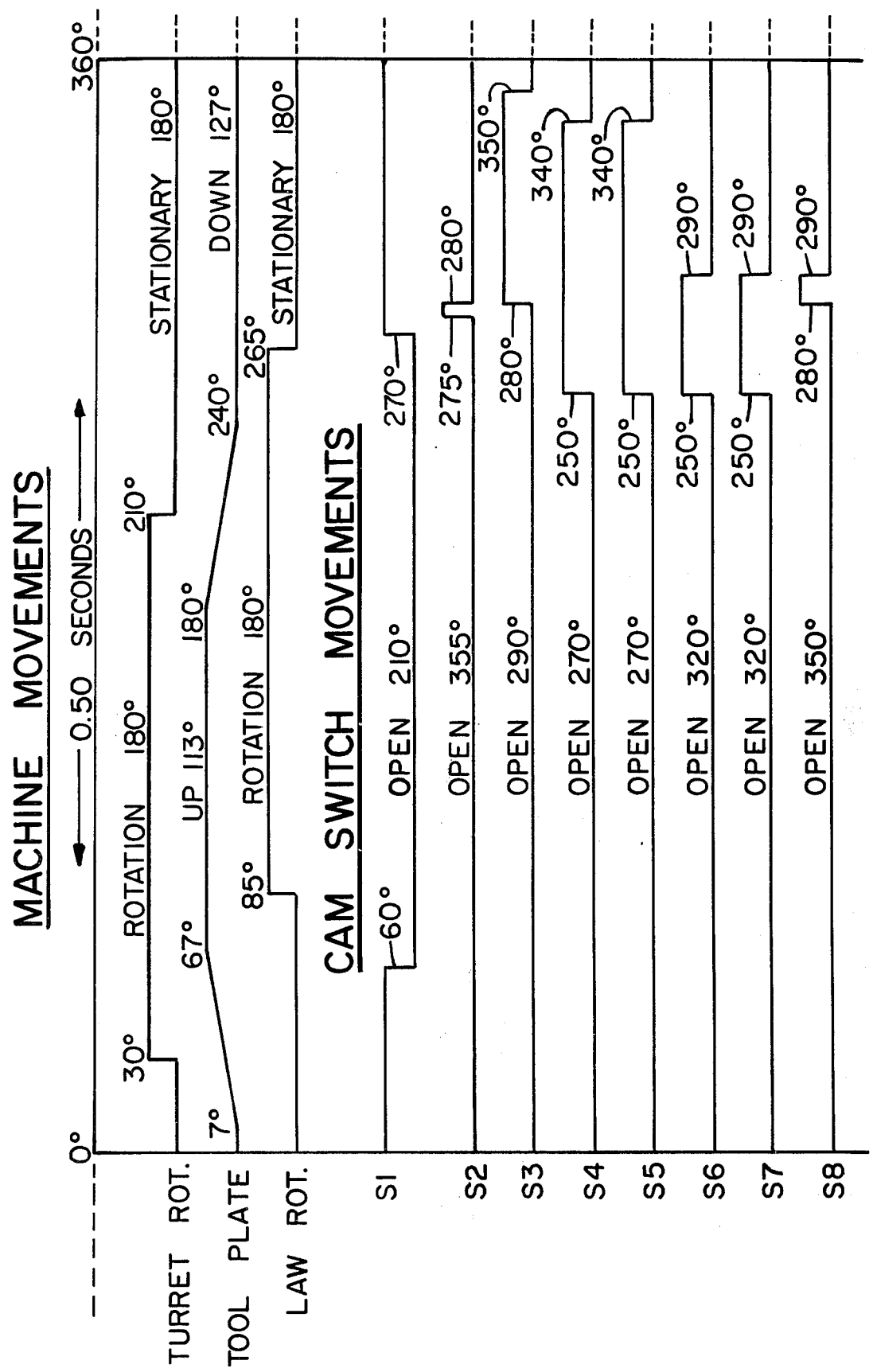
FIG. 26 is a timing or sequence chart which illustrates, in a time or sequential relationship with each other, the sequence of movements and actuations of certain mechanical parts of the invention including electrical circuit controlling contacts actuated by a rotary cam switch or timing drum.

It is believed that it will be expedient to here discuss in conjunction with the timing chart of FIG. 26, the relative actuations of various components of the apparatus of the invention, that is, the time relationship between the actuations of various components of the apparatus as controlled by the switches S1 through S8 of rotating cam limit switch RCLS and also the time relationship between the periodic rotations of turret T, the vertical movements of tool plate TP and the periodic rotations of loading wheel LAW of loading assembly LA. Referring to FIG. 26, a single indexing movement of turret T of the apparatus including rotation of such turret through a 11.25° arc of movement and a stationary dwell period therefor, is performed in 0.50 seconds as shown in FIG. 26 under the heading Machine Movements. However, for the purpose of illustrating actuations of switches S1 through S8 relative to each other and relative to turret T, took plate TP and loading assembly wheel LAW, as well as the movements of these three parts relative to each other, the timing chart of FIG. 26 is shown as being divided into 360° which may, for example, be considered as a single revolution of shaft SH5 and cams C1 through C8 of rotating cam limit switch RCLS (FIG. 25). It should be initially pointed out that the lines of FIG. 26 representing the actuations of the previously discussed sets of contacts S5 and S7 of said rotating cam limit switch illustrate only the closing and opening of the each movable contact member against and away from the fixed front contact of each respective set of contacts and it will be understood that each said respective movable member is closed against the fixed back contact of each said set of contacts when such movable member is not closed against the front contact of the respective set of contacts of switches S5 and S7.

Referring further to FIG. 26, switch S1 controls the opening and closing of the jaws of loading assembly wheel LAW of loading assembly LA and switch S2 controls the energization of stepping motor STM to move chains CH1 and CH2 to deliver a capacitor such as CP to the loading station in preparation for being grasped by the above-mentioned jaws and transferred to capacitor receiving station 1 of the apparatus of the present invention. It will be noted that motor STM is energized for only a very brief period of time 275°–280° and that switch S1 is closed at such time so that the said jaws of said loading wheel LAW are open to receive a capacitor delivered to said loading station as hereinafter discussed in more detail. Switch S3 closes to interrupt energization of clutch brake CB and further operation of the apparatus of the invention when a capacitor is detected as being inadvertently remaining in a capacitor clamping assembly such as CCA indexed to station 32 by turret T, such interruption of the energization of clutch brake CB occurring only when turret T is dwelling, tool plate TP is in its lowered condition and loading assembly wheel LAW is not rotating. (See FIG. 26.)

Switch S4 closes to actuate or switch on a direct current leakage testing device to test such leakage of each capacitor carried to station 14, said test device being discussed hereinafter in conjunction with FIG. 37. Switch S5 is actuated at the same time as switch S4 as shown in FIG. 26 and such switch S5 actuates a reject classification storage and transfer means for controlling a reject of each capacitor transferred or carried to station 18 and classified at station 14 as a reject, that is, as having unsatisfactory direct current leakage characteristics.

Switch S6 closes to actuate or switch on a capacitance testing device to test whether each capacitor carried to station 18 has satisfactory capacitance characteristics and, if so, under which of four capacitance classifications each respective capacitor should be classified. Said capacitance testing devie will be discussed hereinafter in conjunction with FIG. 31. Switch S7 is actuated at the same time as switch S6 as shown in FIG. 26 and such switch S7 actuates a reject classification storage and transfer means, or one of four capacitance classification storage and transfer means for controlling a reject for each capacitor transferred or carried to station 19 and classified as a reject, or for actuating one of the four sorting means at stations 20, 21, 22 or 23 to sort each capacitor into its correct capacitance classification container. It will be noted that switch S6 does not close its contacts for as long a period of time as switch S4. This is because the above mentioned capacitance testing device must be switched off for a short period of time before another or next capacitor can be tested.

Switch S8 in FIG. 26 closes only momentarily, that is, for only 10° of rotation of cam limit switch RCLS, and such closure controls the counting of capacitors transferred to the receiving station 1 of the apparatus from the loading or delivery station adjacent which station 1 is located for receipt of the transferred capacitors. This will be further discussed hereinafter in conjunction with FIG. 32 of the drawings.

It is pointed out with reference to FIG. 26, that the actuations of the switches S2 through S8 of rotating cam limit switch RCLS occur during the dwell or stationary period of turret T and while tool plate TP is in its lowered position. It is also pointed out that switch S1 of the rotating cam switch is closed during most of the above-mentioned periods and also for a first part of each of the periods of rotation of turret T. This holds the jaws of loading assembly wheel LAW of loading assembly LA open to permit the rotation of turret T to remove capacitors from such jaws during first parts of each of the periods of rotation of the turret.

Referring to the rotation of loading assembly wheel LAW relative to the rotation of the turret and the vertical movement of the tool plate as illustrated in FIG. 26, it will be noted that said rotation of wheel LAW starts during the rotation of turret T but is not completed until after the rotation of the turret is completed and tool plate TP is in its lowered position. This assures that each capacitor delivered or transferred by wheel LAW from the loading station, adjacent receiving station 1 of the apparatus, to such receiving station 1 is not so delivered until each respectively transferred or delivered capacitor can be received at the receiving station, that is, so that each capacitor is transferred or delivered to receiving station 1 only when there is a capacitor clamping assembly such as CCA dwelling at the receiving station 1 and tool plate TP is in its lowered position to cause device OW (FIGS. 2, 4 and 7) to open such clamping assembly to receive the transferred capacitor.

It is expedient to here point out that a first source of direct current electrical power of suitable voltage and capacity is provided for operation, control or actuation of most of the electrical components employed in the control system embodied in the invention. However, for purposes of simplification of the drawings, said source is not shown therein but its positive and negative terminals are designated B and N, respectively. Second and third sources of direct current electrical power of suitable voltage and capacity are provided for operation or actuation of the electrical components employed in the previously mentioned direct current leakage tests, such sources being designated PS1 and PS2 and being shown in FIG. 37 of the drawings. The positive and negative terminals of such sources are designated + and −, respectively. A commercial 110 volt power source of alternating current is also employed in the invention, such source not being shown in the drawings for purposes of simplification thereof. The opposite terminals of such power source are designated BX110 and NX110, respectively.

There is shown in FIGS. 27, 28 and 29, a section of a control panel −CP, and first and second terminal blocks −TB1 and −TB2, respectively. Such components are parts of an electronic counter such as is well known in the art and there are several such counters employed in the apparatus of the present invention. Each such counter may, for example, be a Model 7302A4T1 Electronic Counter having a so-called "L" modification and which may be obtained from Automatic Timing & Controls, Inc., which is located in King of Prussia, Pa. The section of the control panel CP shown includes a single row or group of four dials of rotary knobs which control rotary electric switches (not shown) in accordance with the position to which each switch is manually turned or actuated. Such dials are termed "batch preset" dials and, as indicated on panel CP, a batch preset count up to 9999 can be selected by manipulation of the dials. This will be discussed further hereinafter. The above mentioned "L" modification of the electronic counter causes an internal "batch" relay to be energized and become locked in which the batch preset selected by the dials or knobs or panel −CP of the counter is reached. Said batch relay may thereafter be released by depressing a count reset button (not shown) on the control panel −CP or such relay may be released by a separate external push button or similar reset device which, when manually actuated, connects terminals 16 and 17 on terminal board −TB2 to each other. This will be further discussed hereinafter.

Figure 33:
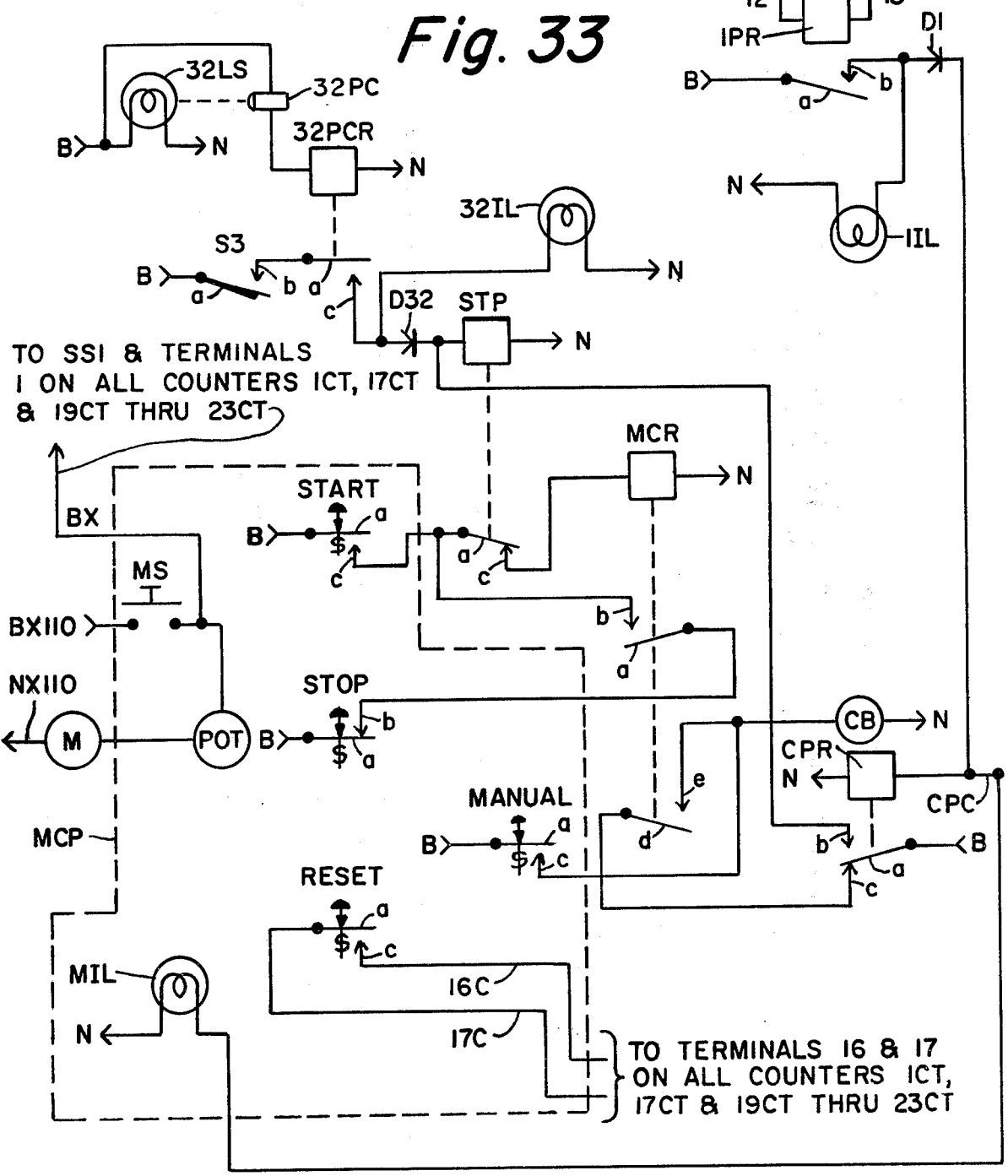

There is shown in FIG. 28 and in conjunction with terminal block TB1, electrical connections for supplying the previously discussed source of commercial alternating current energy to the electronic counter, such connections including a conductor or jumper connected between terminals 2 and 4, a conductor or jumper connected between terminals 3 and 5, a conductor connecting terminal 5 with terminal NX110 of said current source, and a conductor connecting terminal 1 with terminal BX110 through a master switch MS, shown in FIG. 33 and to be discussed, when such switch is actuated, that is, is pushed or depressed and left in such actuated condition.

There is shown in FIG. 29 a batch preset or count relay −CTR whose control winding is connected across terminals 12 and 13 of terminal block TB2 and which is energized to close its contacts $a$–$b$ when the previously mentioned batch preset count, selected by the dials of control panel CP, is reached by the electronic counter. The electrical circuits controlled by said contacts $a$–$b$ of each relay −CTR will be discussed hereinafter. There is also shown in FIG. 29 a relay −PR whose normally open contacts $a$–$b$ are connected across terminals 21 and 22 of terminal block TB2. When a relay such as −PR is momentarily energized, as hereinafter discussed, contacts $a$–$b$ of the relay momentarily close to pulse the respective electronic counter to enter into the respective counter a count of one for each closure of such contacts $a$–$b$ of relay −PR. This will be discussed hereinafter in detail in conjunction with FIGS. 31, 32, 35, 36 and 37 of the drawings in which there are shown electronic counters 1CT, 17CT and 19CT through 23CT, and relays 1PR, 17PR and 19PR through 23PR. It is here pointed out, however, that each such counter has a control panel and terminal boards such as discussed above in conjunction with FIGS. 27, 28 and 29 of the drawings and the relays in 1PR, 17PR, and 19PR through 23PR each correspond to relay −PR shown in FIG. 29.

For purposes of simplification of the drawings, and brevity, to the extent possible, of the description of the control circuits and systems etc. covered by FIGS. 30 through 37 of the drawings, and without sacrifice of a ready understanding of the systems and circuits, etc. controlling the apparatus of the invention, the following expedients are employed to attain said brevity and simplification.

A plurality of electrically controlled or actuated relays are employed and the control winding of each such relay is represented by a rectangle with the designation of the respective relay being disposed above or near the rectangle representing a respective relay winding. The electrical circuit controlling contacts of each such relay are shown below their respectively associated control winding and a broken line extends between each respective relay control winding and its contacts therebelow. The members of each set of contacts of a respective relay are designated by different small case letters, and the fixed contact points or contacts $b$ of each relay, and with which each movable contact member $a$ makes contact, is termed a front contact (downwardly pointing contact against which the respective movable contact member $a$ is closed when the respective relay control winding is energized) or a back contact $c$ (an upwardly pointing contact against which the respective movable contact member $c$ is closed when the respective relay control winding is deenergized). Most of the relays shown are so-called slow release relays and, in such case, an arrow extends through each movable contact or contact member such as $a$ of such relays and points in the direction in which each respective relay (the movable contact members of each relay) is slow acting.

Figure 36:
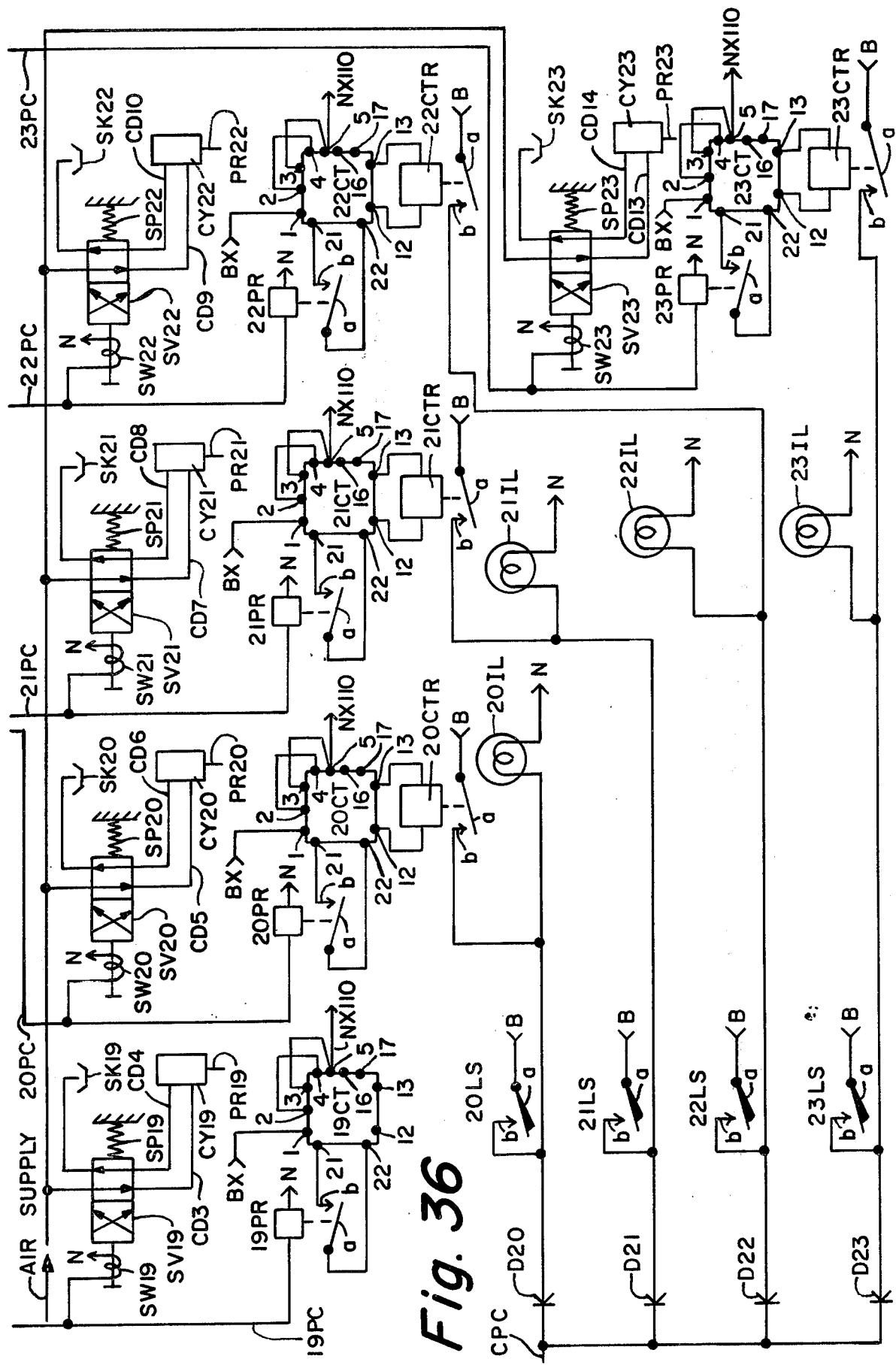

First and second manually operable electrical circuit controlling push-button switches MS and MS1 are shown in FIGS. 31 and 33, respectively, and are of the type whose electrical contacts are normally open but are actuated to and remain in an electrical circuit closing condition when the respective push button is manually pushed or pressed. After the pressing of such push-button switches and the closing of the contacts thereof, such contacts are reactuated to a circuit interrupting condition only when the push-button of the respective switch is manually pulled out of the pressed or closed condition thereof. Switch MS was previously mentioned in conjunction with FIG. 28 of the drawings. A plurality of electric solenoid actuated pressurized fluid flow control valves SV1, SV17, and SV19 through SV23 are shown in FIGS. 34, 36 and 37 in the conventional manner, that is, by conventional symbols, and the previously discussed pressurized fluid cylinders are shown schematically in FIGS. 34, 36 and 37, and are designated by reference characters CY1, CY17, and CY19 through CY23. A suitable source of pressurized fluid, such as compressed air, is also provided for the actuation of the pressurized fluid actuated apparatus. However, said pressurized fluid source is omitted from the drawings for purposes of simplification thereof.

There is shown schematically in FIG. 30 the previously discussed photocell LPC and its associated light source LLS which are also shown in FIGS. 2 and 4 of the drawings. The winding of stepping motor STM previously discussed in conjunction with FIG. 2 is also shown schematically in FIG. 30. Light source LLS is shown in FIG. 30 as connected across terminals B and N of the previously mentioned direct current source and one side of photocell LPC is connected to said terminal B and to one side of the control winding of a relay LPCR, the second side of such winding being connected to said terminal N of the direct current source. As illustrated in FIG. 30, when and as long as a light beam from source LLS impinges on the lens of photocell LPCR such photocell is activated to conducting and relay LPCR is thus normally held energized to close and keep closed its contacts $a$–$b$. Another relay CSP is shown in FIG. 30 and such relay has an energizing or pickup circuit extending from terminal B of the current source over said contacts $a$–$b$ of relay LPCR and thence over contacts $a$–$b$ of previously discussed switch S2 of the rotating cam limit switch RCLS and through the control winding of relay CSP to terminal N of the current source. Relay CSP is also provided with a holding circuit extending from the movable contact member *a* of switch S2 and thence over its own contacts *a–b* and through the control winding of such relay to said terminal N. When switch S2 closes to energize relay CSP and thereafter opens, relay CSP is maintained energized until contacts *a–b* of relay LPCR open due to the interruption of the light beam from light source LLS and the resultant deenergization of the winding of relay LPCR.

There is further shown in FIG. 30 along with stepping motor STM a so-called preset indexer SS1 which when actuated, supplies pulses to stepping motor STM to energize such motor so that its output shaft is rotatively stepped in steps of 1.8° each. Referring again to FIG. 2 of the drawings, pulleys PU9 and PU10 are selected in size so that said rotative steps of stepping motor STM will drive chains CH1 and CH2 (FIGS. 2, 17 and 18) a distance equal to the distance between the centers of two successive capacitors such as CP carried by said chains or, in other words the distance between the centers of two adjacent one of the notches such as NO in the capacitor support blocks such as CSB carried or transported by the chains CH1 and CH2. Indexers such as SS1 and stepping motors such as STM are well known components and, as an example, indexer SS1 may be a type SP800-4 Slo-Syn Preset Indexer and motor STM may be a Slo-Syn Motor, Type SS1800-1007, both of which components are obtainable from the Superior Electric Company, Bristol, Conn. When such an indexer and motor are employed for indexer SS1 and motor STM, contacts *d–e* of relay CSP are connected across terminals 8 and 9 of the indexer while terminals 1 through 5 of the indexer are connected to motor STM. Further discussion of the control system of FIG. 30 of the drawings will be set forth below in conjunction with the control system of FIG. 34 which controls the opening of the jaws of loading assembly wheel LAW for receipt of a lead of a capacitor transported to the loading station by said chains CH1 and CH2.

Referring to FIG. 34, there is shown the previously mentioned solenoid actuated and spring return fluid flow control valve SV1 including a solenoid winding SW1 and a compression spring SP1, such valve controlling a supply of pressurized fluid, such as compressed air for example, to previously discussed pressurized fluid cylinder CY1 for actuation of piston rod PR1 of such cylinder to actuate lever LV to open the jaws of loading assembly wheel LAW (see FIGS. 4, 5 and 6). Solenoid winding SW1 of valve SV1 has an energizing circuit which extends from terminal B of the direct current source over contacts *a–b* of switch S1 of rotating cam limit switch RCLS in their closed condition and thence through said winding to terminal N of the direct current source. Normally, compressed air flows through valve SV1 to conduit CD13 and thence to the left hand end (viewing FIG. 34) of cylinder CY1 while the right hand end of such cylinder is connected over conduit CD14 to a suitable fluid sink SK1. This maintains piston rod PR1 retracted in cylinder CY1. However, when contacts *a–b* of said cam switch S1 are closed, solenoid winding SW1 is energized to actuate valve SV1 against the force of spring SP1 which is then compressed. The compressed air or pressurized fluid then flows through valve SV1 to conduit CD14 while conduit CD13 is connected through the valve to fluid sink SK1. Such operation actuates piston rod PR1 to its extended position to open the jaws of assembly wheel LAW as previously mentioned. When switch S1 again opens its contacts *a–b*, winding SW1 is deenergized and spring SP1 returns valve SV1 to its unactuated condition and piston rod PR1 is again retracted within cylinder CY1. This results in the closing of the jaws of assembly wheel LAW.

Returning to FIG. 26, it will be noted that switch S1 closes its contacts *a–b* (FIG. 34) to cause the jaws of assembly wheel LAW to open at the 270° point in the rotation of the cam switch RCLS while switch S2 does not close its contacts *a–b* until the 275° point in the rotation of the cam switch. It is thus assured that the jaws of wheel LAW are open to receive a capacitor when stepping motor STM is actuated to drive chains CH1 and CH2 to transport a capacitor to the capacitor loading station and into the open jaws of LAW at such station. Referring again to FIG. 30, it will be noted that indexer SS1, when once actuated by the closing of contacts *a–b* of switch S2 and the resulting closing of contacts *d–e* of relay CPS, remains actuated to continue to step motor STM until a capacitor lead interrupts the light beam from light source LLS, such interruption occurring when such a lead moves through such beam during the transport of a capacitor to the loading station. When this happens, relay LPCR momentarily opens to open at its contacts *a–b* the holding circuit for relay CSP which then releases and opens its contact *d–e* to no longer actuate indexer SS1 and to thereby stop the stepping of motor STM and movement of chains CH1 and CH2. The deenergization of relay CSP also opens its own contacts *a–b* to further interrupt the holding circuit of such relay.

Figure 32:
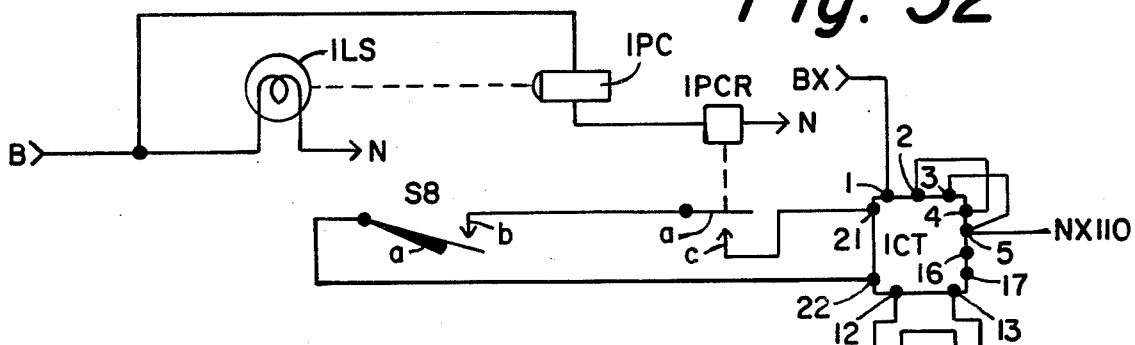

There is schematically shown in FIG. 32 the previously discussed photocell 1PCR which receives a light beam from light source 1LS when there is no capacitor in a capacitor clamping assembly such as CCA at station 1, that is, at the capacitor receiving station of the apparatus. Light source 1LS is connected across terminals B and N of the direct current source and another circuit extends from such terminal B through the photocell 1PC and thence to one side of the winding of a relay 1PCR, and through such winding to terminal N of the battery. Relay 1PCR is thus energized when photocell 1PC receives a light beam from source 1LS. There is also shown in FIG. 32 an electronic counter 1CT which is a counter such as that shown in FIGS. 27, 28 and 29 and which is connected in the same manner as such latter counter and includes a relay 1PR connected across terminals 12 and 13 of counter 1CT. Counter 1CT has an actuating circuit connected across terminals 21 and 22 of the counter and including, in series, contacts *a–b* of switch S8 of cam switch RCLS and contacts *a–c* of above mentioned relay 1PCR. It is pointed out, with reference to FIG. 26, that said contacts *a–b* of switch S8 are closed only momentarily (from 280° to 290° of rotation of cam switch RCLS) and that at such time a rotation of wheel LAW has been completed. If such rotation of such wheel transferred or delivered a capacitor to receiving station 1, the light beam from source 1LS is interrupted by such capacitor, relay 1PCR is released to close its contacts *a–c* and said closure of contacts *a–b* of switch S8 will complete the circuit between terminals 21 and 22 of counter 1CT to enter a count of 1 into such counter. It will, therefore, be apparent that each capacitor delivered to or received at receiving station 1 is counted by counter 1CT to maintain a tally of the number of capacitors delivered to the apparatus of the invention. Assuming that the dials of such counter are set for a count of 9999, that quantity of capacitors can be delivered to the apparatus before any action must be taken. However, when such a count is reached by counter 1CT, relay 1PR connected to the counter is energized and closes its set of contacts a–b to complete an obvious energization circuit to an indication light 1IL associated with station 1 and, through a diode D1, an energization circuit to a relay CPR for energization of such relay for a purpose hereinafter discussed. It is here pointed out, however, that the dials of counter 1CT can, of course, be set to a lesser number than 9999 if a lot or batch of capacitors to be tested and sorted by the apparatus of the invention is less than 9999. If the lot or batch of capacitors to be tested and sorted is greater than 9999, however, such a tally, when reached, must be manually recorded and counter 1CT then reset, in the manner hereinafter discussed, for a further count of capacitors. This will be further clarified hereinafter.

It is believed expedient at this point in the description to discuss the circuits, control systems and additional components shown in FIG. 33 of the drawings.

A master control panel MCP is shown in FIG. 33 in broken line outline form and such panel includes the previously mentioned master switch MS, a potentiometer POT, four spring return manually actuable or depressed push buttons designated START, MANUAL, RESET and STOP, respectively. The first three of such push buttons have normally open contacts a–c which are actuated to closed by the depressing of each respective push button and which are returned to open conditions by their respective springs when they are no longer depressed. The STOP push button has a pair of normally closed contacts a–b which are actuated open by depressing of the push button and which are returned to closed by its spring when the push button is no longer depressed. Panel MCP further includes a master indication light MIL provided for a purpose hereinafter discussed.

FIG. 33 also schematically shows previously mentioned light source 32LS and photocell 32PC located at station 32. Light source 32LS is energized by being connected across terminals B and N of the direct current source and a circuit extends from said terminal B through photocell 32PC, and thence to one side of the control winding of a relay 32PCR and through such winding to terminal N of the current source. Thus, if turret T is dwelling and a capacitor clamping assembly CCA, without a capacitor therein, is at station 32, relay 32PCR is energized to open its contacts a–c. This is, of course the normal condition since each capacitor should have been rejected or sorted out prior to each respective capacitor clamping assembly reaching station 32. However, as previously mentioned, if a capacitor inadvertently remains in clamping assembly CCA, when such assembly arrives at station 32 and dwells at such station (turret T is dwelling) the light beam to 32PC is interrupted and relay 32PCR releases to close its contacts a–c and prepare an energizing circuit for a relay STP, such circuit being completed when switch S3 of cam switch RCLS closes at the 280° point in the rotation of the cam switch (after the beginning of a dwell period of turrent T as shown in FIG. 26). Said energizing circuit for relay STP extends from terminal B of the current source over contacts a–b of switch S3, contacts a–c of relay 32PCR and thence, in multiple, to an indication light 32IL to terminal N of the current source, and through a diode D32 to one side of the winding of relay STP and through such winding to terminal N of the current source. Relay STP becomes energized under such conditions to open its contacts a–c to deenergize a relay MCR when such relay is enrgized as discussed below.

Relay MCR is a master control relay which, in conjunction with above mentioned relay CPR, controls the energization of clutch CB hereinbefore discussed in conjunction with FIG. 25 and whose winding is schematically shown in FIG. 33. Relay MCR has a pickup or energizing circuit which extends from terminal B of the current source over contacts a–c of the start push button START in the manually pressed or actuated condition of such button (previously discussed) and thence over contacts a–c of relay STP and through the winding of relay MCR to terminal N of the current source. Relay MCR also has a holding circuit which extends over contacts a–b of the previously discussed stop push button STOP and thence through contacts a–b of relay MCR in their closed condition, contacts a–c of relay STP in their closed condition and thence through the winding of relay MCR to terminal N of the current source. Thus, when relay MCR is energized by the depressing of push button START, it remains energized until push button stop is depressed or until relay STP becomes energized. The energization of relay MCR closes, at contacts d–e of such relay, the energizing circuit for the winding of clutch brake CB, such circuit extending from terminal B of the direct current source over contacts a–c of previously mentioned relay CPR, contacts d–e of relay MCR and thence through the winding of clutch brake CB to terminal N of the current source. The energization of the winding of clutch brake CB releases the brake and engages the clutch of such component and, if motor M (FIGS. 25 and 33) is energized at such time, the operation of the apparatus of the invention is started. It is pointed out that the winding of clutch brake CB can also be energized by the depression of the push button MANUAL previously discussed and such energization will continue only so long as the button is held depressed. This permits manual control of the apparatus of the invention.

Assuming, for the purposes of a brief operational example of some of the apparatus of the invention, that the winding of clutch brake is energized and the apparatus of the invention is operating, if a capacitor is stuck in a clamping assembly CCA moved to station 32 as discussed above, relay STP becomes energized to release relay MCR and deenergize the winding of clutch brake CB to stop the apparatus. Similarly, when the capacitor count, selected on counter ICT (FIG. 33) as discussed above is reached, relay 1PR is energized to, in turn, energize relay CPR which energizes relay STP, over contacts a–b of relay CPR, to release relay MCR to stop the apparatus. The energization of relay CPR also opens, at contacts a–c of such relay, the energizing circuit for the winding of clutch brake CB, such circuit being opened by relay CPR at an earlier point in time than such circuit is opened by the energization of relay STP. However, the energization of relay STP opens the holding circuit for relay MCR to further interrupt the energizing circuit for the winding of clutch brake CB and maintain such circuit open until the start push button START is again manually depressed.

It is pointed out that the previously discussed indication lights or lamps 1IL in FIG. 32 and 32IL in FIG. 33 are each separately energized to indicate to operating personnel what has stopped the operation of the apparatus, that is, that counter 1CT has reached its preselected count or that there is a capacitor at station 32, respectively. Diode D1 prevents the energization of indication light 1IL when relay CPR is energized by other circuits to be described and diode D32 prevents the energization of indication light 32IL when relay CPR is energized by such other circuits or by the energization of relay 1PR by counter 1CT.

It is believed expedient to here point out that above mentioned master switch MS on panel MCP in FIG. 33, when depressed, connects the previously mentioned source of alternating current through potentiometer POT to motor M for energization of such motor. Potentiometer POT is used to slowly bring the apparatus up to full operating speed for checking and adjustment thereof. It is also pointed out that the reset button RESET on panel MCP in FIG. 33 is, as indicated in such drawing figure, connected in multiple across terminals 16 and 17 of counter 1CT as well as of all the other counters 17CT and 19CT through 23CT employed. Each such counter has its own individual reset button for resetting each respective counter to zero but said push button RESET is a master reset button which resets all counters to a zero count simultaneously. Reference is made to the previous discussion of the parts of the counter shown in FIGS. 27, 28 and 29 of the drawings.

Figure 37:
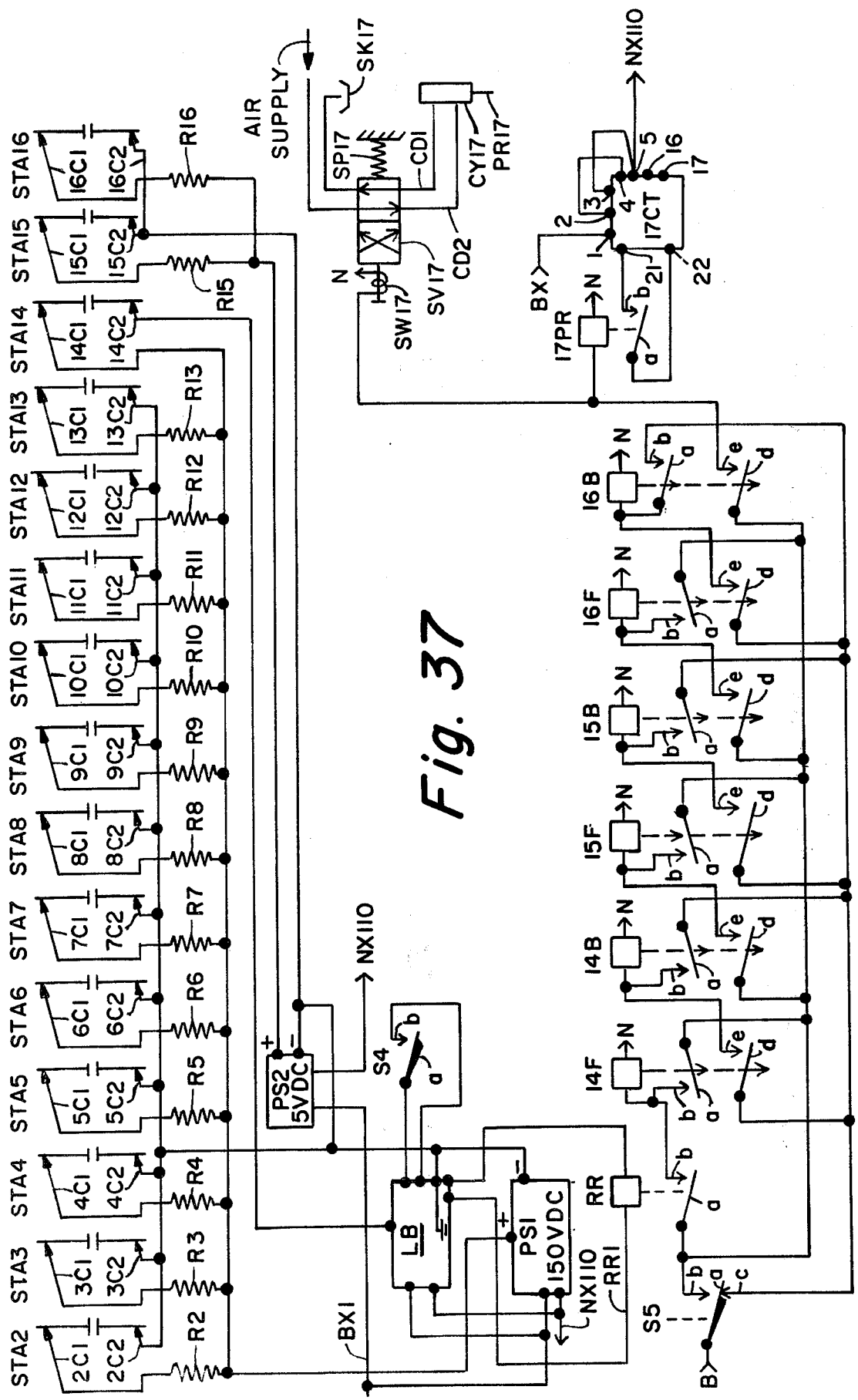

Referring to FIG. 37 of the drawings, there is schematically shown the previously described capacitor lead contacting assemblies or contactor devices provided at stations 2 through 16 and each of which is similar to the contacting assembly 9TA at station 9 and shown in detail in FIGS. 13 and 14. As previously mentioned the contacting assemblies at stations 2 through 13 are capacitor charging assemblies, the assembly at station 14 is a capacitor direct current leakage testing assmebly and the assemblies at stations 15 and 16 are capacitor discharging assemblies. The twelve capacitor charging assemblies are provided to assure sufficient charging of each capacitor before it is tested and the two discharge assemblies are provided to assure complete discharging of each capacitor before it is rejected at station 17 or carried on to the capacitance testing station 18 (FIG. 31). The previously mentioned direct current power sources PS1 and PS2 are connected across the aforesaid 110 volt source of alternating current through previously mentioned master switch MS1 (FIG. 31) and over a conductor BX1 connected to such switch and shown extending to FIG. 37 of the drawings and thence to one of the AC input terminals of each said power source PS1 and PS2, the other AC input terminals of each such source being connected to terminal NX110 of the alternating current source. The AC input terminals of a direct current capacitor leakage testing device or limit bridge LB (FIG. 37) to be discussed, is similarly connected across said source of alternating current. Master switch MS1 may, in practice, be mounted in any convenient manner at any suitable location near one of the testing apparatuses of the invention, to be discussed, or one of the aforesaid direct current power sources PS1 or PS2. The above mentioned direct current leakage or testing device LB may, for example, be a Model 5355 Capacitor IR/Leakage Current Limit Bridge which is obtainable from Micro Instrument Company whose address is 12901 Crenshaw Boulevard, Hawthorne, Calif. Contacts $a$–$b$ of switch S4 of rotating cam limit switch RCLS are connected across the "gating-on" or trigger contacts of limit bridge LB for actuation of such bridge to on when said contacts $a$–$b$ close as previously discussed in conjunction with FIG. 26. The positive (+) output terminal of power source PS1 (150VDC) is connected through current limiting resistors R2 through R13 to the terminals at the upper end of capacitor lead contactors or probes 2C1 through 13C1, respectively, of the contactor assemblies at stations 2 through 13, respectively, while the negative (−) output terminal of power source PS1 is connected to the grounded terminal of test device LB and in multiple to the terminals at the upper ends of capacitor lead contactors or probes 2C2 through 13C2 of said contactor assemblies. By such arrangement, whenever tool plate TP is actuated to its lower position the lower tips of said contactors contact the leads of the capacitors then clamped in the capacitor clamping assemblies such as CCA at stations 2 through 13, as schematically illustrated in FIG. 37, to supply an electrical charge to each such capacitor at each of said stations.

At station 14 (FIG. 37) the positive (+) output terminal of power source PS1 is connected directly to the terminal at the upper end of capacitor lead contactor or probe 14C1 of the contactor assembly at station 14 while the test terminal of test device or limit bridge LB is connected to the terminal at the upper end of capacitor lead contactor or probe 14C2 of the contactor assembly at station 14. The decision on the leakage current of each capacitor tested at station 14 by limit bridge or test device LB is supplied across the winding of a relay RR from the decision output terminals of the test device or limit bridge LB which are energized each time an unsatisfactory decision on the current leakage of a capacitor results. Each such unsatisfactory decision thus causes the energization of relay RR (FIG. 37).

Referring further to FIG. 37, contact $b$ of above mentioned relay RR is connected to one side of the winding of a relay 14F, the second side of such relay being connected to terminal N of the direct current source. Contact $a$ of the pair of contacts $a$–$b$ of relay RR connects to a front contact $b$ of a set of contacts $a$–$b$–$c$ of switch S5 of cam switch RCLS while the movable member $a$ of such set is connected to terminal B of the direct current source. Contacts $a$–$b$ of switch S5 are closed and opened at the same times as the contacts $a$–$b$ of switch S4 (see FIG. 26) of limit switch RCLS and, therefore, whenever relay RR becomes energized to indicate an unsatisfactory leakage decision from limit bridge LB, relay 14F is energized and closes its two pairs of contacts $a$–$b$ and $d$–$e$. When contacts a-b of relay 14F close a holding circuit for relay 14F is completed over its own contacts $a$–$b$ and said contacts $a$–$b$ of switch 55. When contacts $a$–$b$ of switch 55 open and contacts $a$–$c$ of such switch close, an energizing circuit for a relay 14B is closed, such circuit extending over said contacts $a$–$c$ of switch S5, said contacts $d$–$e$ of relay 14F and through the winding of relay 14B to terminal N of the current source. It is pointed out that relay 14F is a slow release relay such as previously discussed and the delay provided by such feature of the relay is long enough only to bridge the transfer of contact $a$ of switch S5 from in contact against front contact $b$ of the switch to in contact against back contact $c$ of the switch to ensure that relay 14B will be energized prior to the opening of contacts $d$–$e$ of relay 14F. When relay 14B is energized it closes a holding circuit for itself including its own contacts $a$–$b$ and said contacts $a$–$c$ of switch S1. The energization of relay 14B also prepares, at contacts *d-e* of such relay, an energizing circuit for a relay 15F. Relay 14F releases following the delay provided by the slow release feature of the relay. It may be said that relay 14B has stored an unsatisfactory leakage decision for the capacitor at station 14.

Upon the next closure of contacts *a-b* of switch S5 (which means that the capacitor previously at station 14 has been transferred to station 15) relay 15F is energized over said contacts *a-b* of switch S5 and contacts *d-e* of relay 14B, such relay also being slow release to bridge the transfer time of contact *a* of switch S5 from contact *c* to contact *b* thereof. The energization of relay 15F closes at front contacts *a-b* of such relay a holding circuit for itself including contacts *a-b* of switch S5. Relay 14B releases following the expiration of its slow release delay period. If another unsatisfactory capacitor is tested at station 14, upon the closing of contacts *a-b* of switch S5, relay 14F is again energized over contacts *a-b* of relay RR to make the storage of an unsatisfactory or reject classification for such other capacitor the same as with the capacitor at station 15. Upon the subsequent release of switch S5 relay 15B is energized and relay 15F subsequently releases. At such time relay 14B also becomes energized to store the unsatisfactory classification for the capacitor at station 14. It is believed that it will be apparent from the above descriptions how unsatisfactory or reject classifications for capacitors are transferred along with the respective capacitors as each capacitor is transferred to the next succeeding station in the rotation of turret T. It will be noted that when a capacitor is classified as satisfactory at station 14, relay RR is not energized and no unsatisfactory or reject classification is initiated or stored and none of the relays 14F, 14B, 15F etc. are energized during the transfer of such satisfactory capacitor. A pair of capacitor reject classification transfer relays, similar to relays 14F and 14B associated with station 14, are associated with each of the stations 15 and 16 and all such relays are slow release for the purpose mentioned above.

When an unsatisfactory or reject classification is stored for a capacitor at station 16 (relay 16B is energized and held energized over its holding circuit) and switch S5 again opens its contacts *a-c* and closes its contacts *a-b* due to another transfer of capacitors including the transfer of the capacitor at station 16 to station 17, a circuit is momentarily completed from terminal B of the current source over contacts *a-b* of switch S5 and contacts *d-e* of relay 16B through the control winding of a relay 17PR and through the solenoid winding SW17 of a solenoid actuated pressurized fluid or compressed air control valve SV17. Relay 17PR is energized to close its contacts *a-b* and enter a reject count into a counter 17CT, while valve SV17 is shifted so that pressurized fluid or compressed air is supplied over conduit CD1 to the upper end of previously discussed cylinder CY17 while the lower end of such cylinder is connected through valve SV17 to a fluid sink SK17. This momentarily actuates piston rod PR17 of cylinder CY1 and pin P17 downwardly to contact the roller 34 (see FIGS. 11 and 12) of the clamping capacitor assembly CCA then at station 17 and open such assembly to release the reject capacitor then carried thereby, such released capacitor falling from the clamping assembly through slot 24 into a reject bin (not shown) provided below turret T at station 17. As mentioned above, the energization of relay 17PR and of solenoid winding SW17 is only momentary since the energizing circuit therefor is again opened when relay 16B releases following its slow release delay period. Upon the opening of the circuit to the solenoid winding SW17 ing SP17 of valve SV1 returns such valve to its normal condition shown and compressed air is again supplied to the lower end of cylinder CY17 to retract PR17 while the upper end of cylinder CY17 is again connected to fluid sink SK17. The upward actuation or retraction of piston rod PR17 causes the lower beveled or tapered end of pin P17 on the lower end of such piston rod (FIGS. 11 and 12) to clear assembly CCA for the next rotation of turret T. It is apparent that when a capacitor with satisfactory direct current leakage characteristics is transferred to station 17 no actuation of relay 17PR and 17CT or of solenoid valve SV17 occurs since there is no unsatisfactory or reject classification stored by relay 16B at such time. The capacitor at station 17 is, therefore, transferred on to station 18 upon the next indexing movement of turret T.

As previously mentioned stations 15 and 16 shown schematically in FIG. 37 are capacitor discharge stations for discharging the electrical charges supplied to capacitors at stations 2 through 13 and remaining on the capacitors when they arrive at stations 15 and 16. For such purpose the terminals at the upper ends of the capacitor lead contactors or probes 15C1 and 16C1 of the contactor devices or contacting devices 15TA and 16TA at stations 15 and 16 are connected through resistors R15 and R16, respectively, to the positive (+) terminal of previously mentioned power source PS2 while the negative (−) terminal of such source is connected in multiple to the grounded terminal of power source PS1, and to the terminals at the upper ends of the capacitor lead contactors or probes 15C2 and 16C2 of said contacting assemblies 15TA and 16TA. When tool plate TP is lowered, said contactors or probes contact the leads of the capacitors at stations 15 and 16 to electrically discharge such capacitors.

Referring to FIG. 31, taken in conjunction with FIGS. 1, 15 and 16, there is shown schematically at station 18 capacitor lead contactors 18C1, 18C2 and 18C3 which correspond to the capacitor lead probes or contactors 18C1, 18C2 and 18C3, respectively, of capacitor lead contacting device 18TA shown in FIGS. 1, 15 and 16 of the drawings. Another capacitor lead contactor 18C4 is shown in FIG. 31 but such contactor is not shown in FIGS. 15 or 16 for purpose of simplification of such drawings. The terminals at the upper end of the pair of capacitor lead contactors 18C1 and 18C3 (FIG. 31) are connected over conductors TC1 and TC1A, respectively, to positive test terminals of a capacitance testing device CLB to be discussed below. The terminals at the upper ends of the capacitor lead contactors 18C2 and 18C4 (FIG. 31) are connected over conductors TC2 and TC2A to negative test terminals of said capacitance testing device CLB.

The above mentioned capacitance testing device CLB tests the dissipation factor and capacitance of capacitors such as CP shown in FIG. 17. Such testing device may, for example, be a Model 5310 Capacitance Limit Bridge which is obtainable from the previously mentioned Micro Instrument Company, such limit bridge being capable of rendering three reject decisions such as high capacitance, low capacitance, and high dissipation factor, and an accept decision. However, since in the apparatus of the present invention it is desired to sort the capacitors such as CP into a reject classification, or one of four capacitance classifications, a Model 5314 Capacitance Limit Add-on Unit is employed in conjunction with the Model 5310 limit bridge, such add-on unit being obtainable from the same company as the limit bridge and the devices being connected with each other by a suitable cable shown in FIG. 31 as CBL. The Add-on unit is designated CU in FIG. 31 and provides for additional test decisions as set forth hereinafter. Testing device CLB is also connected through the previously mentioned master switch MS1, in its depressed or actuated condition, across terminals BX110 and NX110 of the previously mentioned source of alternating current.

From FIG. 15 of the drawings it will be seen that capacitor lead contactor 18C1 will, when tool plate TP is in its lowered position, contact the conductor plate 21 of a clamping assembly such as CCA then at station 18 and, thereby, make electrical contact with the lead of a capacitor such as CP in such clamping assembly. At the same time capacitor lead contactor 18C3 will contact said lead directly to make electrical contact therewith. It will be readily understood that the second pair of capacitor lead contactors 18C2 and 18C4 (FIGS. 16 and 31) similarly make contact with the second lead of the capacitor such as CP when a clamping assembly such as CCA is at station 18 and tool plate TP is in its lowered position. It is pointed out that the use of two pairs of respectively associated capacitor lead contactors such as 18C1 and 18C3, and 18C2 and 18C4, and two pairs of associated conductors such as TC1 and TC1A, and TC2 and TC2A provide for so-called Kelvin connections which, along with another terminal at system ground, provide for the elimination of errors due to any series resistance such as, for example, electrical conductor resistance which would affect dissipation factor tests.

Referring further to FIG. 31, contacts $a-b$ of switch S6 of rotating cam limit switch RCLS close (see FIG. 26) for 40° of rotation of such cam switch RCLS and while tool plate TP is in its lowered position. Such contacts $a-b$ of switch S6 are connected across a pair of terminals of unit CU for the purpose of triggering the capacitance testing apparatus to on to initiate a test. Three output terminals of unit CU, which become energized to reflect a reject decision because of a high dissipation factor, a high capacitance or a low capacitance for a capacitor tested, are connected to each other and then, over a conductor CRC to one side of a winding of a reject relay CR, the second side of such winding being connected to a terminal N1 of unit CU for energization of such relay when a reject decision such as stated is made. Four additional terminals of unit CU are connected over conductors C2C, C3C, C4C and C5C (FIGS. 31 and 35) to one side of the windings of sorting or classification relays 1CL, 2CL, 3CL and 4CL, respectively, the second side of each said winding being connected to said terminal N1 of unit CU. Relays 1CL through 4CL are associated with the previously mentioned capacitance classifications which may, for example, be +10% to +20% (classification 1) +5% to +10% (classification 2) +5% to −5% (classification 3) and −5% to −10% (classification 4), such percentages being, of course, the nominal rating of capacitors to be tested plus or minus the stated percentages. It is again pointed out that, in the example of the invention set forth, the capacitors tested by limit bridge CLB and add-on unit CU may have a reject classification, or one of the four satisfactory capacitance classifications as set forth above.

Referring further to FIG. 31, there is chematically shown the previously mentioned light source 18LS and photocell 18PC (see also FIGS. 1, 15 and 16) which is located at station 18. Light source 18LS is shown in FIG. 31 as connected across terminals B and N of the previously mentioned current source and when such light source is so energized a light beam impinges at times on the lens of photocell 18PC to activate such photocell and complete and energizing circuit for a relay 18PCR, such circuit extending from terminal B of the current source through photocell 18PC and thence to one side of the winding of relay 18PCR and through such winding to terminal N of the current source. It will be apparent that when a capacitor clamping assembly such as CCA is dwelling at station 18 and there is no capacitor in such clamping assembly, said light beam from 18LS to photocell 18PC is completed and relay 18PC is energized to open its contacts $a-c$. However, when a capacitor is present in a clamping assembly such as CCA dwelling at station 18, said light beam is interrupted and relay 18PCR is deenergized or released to close its contacts $a-c$ to prepare an energizing circuit to a conductor 18FC for energization of a relay 18FO, 18F1, 18F2, 18F3 or 18F4 (FIGS. 31 and 35,) such relays being capacitor classification relays associated with station 18.

Contacts $a-b-c$ of switch S7 of rotating cam limit switch RCLS are shown in FIG. 31 and contacts $a-b$ of such switch close (FIG. 26) at the same time as contacts $a-b$ of switch S6 mentioned above and which trigger the capacitance test devices CLB and CU to on. Said contacts of switch S7 also open at the same time as contacts $a-b$ of switch S6 as illustrated in FIG. 26.

There are shown in FIG. 31 a pair of relays 18FO (previously mentioned) and 18BO which are reject classification transfer relays associated with station 18. Such relays are similar to the pair of relays 14F and 14B shown in FIG. 37 and previously discussed. However, it is believed it may be expedient to give a brief operational example of the operation of relays 18FO and 18BO when a capacitor is present in a clamping assembly such as CCA and such capacitor is classified as a reject by the capacitance testing apparatus associated with station 18 as, for example, when such capacitance has an unsatisfactory dissipation factor, an unsatisfactorily high capacitance, or an unsatisfactorily low capacitance.

Assuming then that a capacitor such as mentioned above is transported to station 18 and tool plate TP is moved to its lowered position, capacitor lead contacting device 18TA (FIGS. 15 and 16) is lowered by tool plate TP to contact the leads of said capacitor. Very briefly thereafter contacts $a-b$ of switch S6 close to trigger the capacitance testing apparatus to on to test the capacitor and, in an assumed case of unsatisfactory or reject decision or classificaton for the capacitor, relay CR is energized by the testing apparatus to reflect a reject decision thereof. Contacts $a-b$ of switch S7 close at the same time as said contacts of switch S6 and, there being a capacitor at station 18, relay 18PCR is deenergized and has its contacts $a-c$ closed. Thus, when reject classification relay CR is energized and closes its contacts $1-b$, the above mentioned reject classification transfer relay 18FO is energized over conductor 18FC and closes a holding circuit for itself including its own contacts $a-b$ and contacts $a-b$ of switch S7. The energization of relay 18FO also prepares, at contacts d–e of such relay, an energization circuit for reject classification transfer relay 18BO.

When contacts a–b of switch S6 again open, the capacitance testing apparatus is no longer triggered to on and reject classification relay CR is deenergized and releases to open its contacts a–b. Contacts a–b of switch S7 open at the same time as contacts a–b of switch S6 and contacts a–c of such switch S7 thereafter close to close the energization circuit for relay 18BO. Relay 18BO is thus energized to close a holding circuit for itself including its own contacts a–b and said contacts a–c of switch S7. Relay 18FO releases following the brief time delay provided by the slow release feature of such relay. The above mentioned energization of relay 18BO prepares at contacts d–e of such relay energizing circuits to one side of the solenoid winding SW19 of a pressurized fluid flow control valve SV19 and to one side of the winding of a relay 19PR (FIG. 36) the second sides of such windings being connected to terminal N of the direct current source. Such energization circuits extend from contact e of relay 18BO over a conductor 19PC and thence (through FIG. 35) to one side of said winding SW19 and one side of said winding of relay 19PR (FIG. 36).

When contacts a–b of switch S7 again close at the time of the testing of a next capacitor transferred to station 18, (the previously tested capacitor having been transferred to station 19) the above mentioned prepared circuits are momentarily completed over contacts a–b of switch S7 and solenoid winding SW19 and the winding of relay 19PR become momentarily energized. The energization of solenoid winding SW19 causes valve SV19 to shift to momentarily connect pressurized fluid or compressed air over a conduit CD4 to the upper end of a reject cylinder CY19 at station 19 while the lower end of such cylinder is connected over a conduit CD3 to a fluid sink SK19. This actuates piston rod PR19 of cylinder CY19 out of such cylinder to open the clamping assembly CCA which is then at station 19 and is carrying the capacitor with the reject classification. Such opening of the clamping assembly causes said capacitor to fall therefrom in the manner previously described in conjunction with the rejection of a capacitor at reject station 17, such capacitor falling into a suitable capacitance reject bin located at station 19 below turret T. The above mentioned momentarily energization of relay 19PR associated with station 19 also momentarily closes at contacts a–b of such relay a trigger circuit for a counting device 19CT associated with station 19, such counting device keeping a tally of capacitors rejected at such station. Counter 19CT is similar to counter 17CT previously discussed and, as with counter 17CT, counter 19CT is connected as shown in FIGS. 28 and 29 of the drawings except that a relay such as –CTR shown in FIG. 29 is not connected across terminals 12 and 13 of terminal board or block TB2 of counter 19CT. Returning to FIG. 31, when the delay period provided by the slow release feature of relay 18BO expires, such relay releases to open the energization circuits for solenoid winding SW19 of valve SV19 and for relay 19PR, and such components are deenergized and they return to their normal conditions shown in FIG. 36 of the drawings.

There are classification transfer relays 18F1 and 18B1, and 19F1 and 19B1 (FIG. 31) associated with stations 18 and 19, respectively. These relays transfer through station 19 and to station 20 capacitance classifications 1 for capacitors having such a capacitance classification. When each such capacitor reaches station 20, a set of components SV20 and 20CT (FIG. 36) are actuated in the same manner as the similar components for stations 17 or 19 but, for the purpose of shortening repetitious description to the extent possible, no detail description of the components at station 20 will be given. It is, however, pointed out that the counter 20CT (FIG. 36) associated with station 20 has connected across terminals 12 and 13 thereof a relay 20CTR which is energized to close a set of contacts a–b of such relay whenever a preset capacitor count manually selected on counter 20CT is reached. The circuit controlled by contacts a–b of relay 20CTR will be discussed hereinafter.

There is associated with each of the stations 18, 19 and 20, respectively, a pair of relays 18F2 and 18B2, 19F2 and 19B2, and 20F2 and 20B2, respectively (FIG. 35). Such relays are capacitance classification 2 transfer relays and such classifications are transferred by such relays to station 21 for each capacitor having such a capacitance classification and which is, therefore, to be sorted out and counted at station 21 by actuation of a solenoid valve SV21 and a counter 21, respectively (FIG. 36) associated with such station. Similarly, pairs of third capacitance classification transfer relays 18F3 and 18B3, 19F3 and 19B3, 20F3 and 20B3, and 21F3 and 21B3 are associated with stations 18, 19, 20 and 21, respectively, for transferring capacitance classifications 3 through such stations to station 22 for sorting out and counting by, actuation of a solenoid valve SV22 and a counter 22CT (FIG. 36) capacitors transferred to station 22 and having a capacitance classification 3. Pairs of fourth capacitance classification transfer relays 18F4 and 18B4, 19F4 and 19B4, 20F4 and 20B4, 21F4 and 21B4, and 22F4 and 22B4 are associated with stations 18, 19, 20, 21 and 22, respectively, for transferring capacitance classification 4 through such stations to station 23 for sorting out and counting, by actuation of a solenoid valve SV23 and a counter 23CT (FIG. 36) capacitors having a capacitance classification 4. It is pointed out that the counters 21CT, 22CT and 23CT have relays 21CTR, 22CTR and 23CTR, respectively, associated therewith and connected across terminals 12 and 13 of each respective counter in the same manner in which relay 20CTR is connected across terminals 12 and 13 of counter 20CT discussed above. Relays 21CTR, 22CTR and 23CTR are each energized when the capacitors sorted out at stations 21, 22 and 23, respectively, have reached a preselected count manually selected on counters 21, 22 and 23, respectively.

Referring further to FIG. 36, the previously mentioned circuit controlled by contacts a–b of relay 20CTR extends from terminal B of the current source over said contacts a–b and through a diode D20 to a conductor CPC and to the winding of previously discussed relay CPR (FIG. 33). There is also associated with station 20 a limit switch 20LS which corresponds to the limit switch such as LS shown in FIGS. 19, 20 and 21 and which is supported at station 20 on a container holder such as CTH (FIGS. 19, 20 and 21) for supporting or holding a container such as CT (FIGS. 22, 23, and 24) as previously discussed. Assuming that a holder 20CTH at station 20 has inserted therein a container such as CT, contacts a–b of limit switch 20LS are open as shown in FIG. 36. However, when the container CT is removed from holder 20CTH, limit switch 20LS is actuated to close its contacts *a–b* and close another circuit extending from terminal B of the current source and through diode D20 to relay CPR such circuit being in multiple with the circuit over contacts *a–b* of relay 20CTR. The filament of an indication relay 20IL has one of its ends connected to the circuit controlled by contacts *a–b* of relay 20CTR and of limit switch 20LS and the other end of such filament is connected to terminal N of the current source. It is believed apparent that indication lamp is thus energized to give an indication that counter 20CT has reached its preselected count or an indication that container holder 20CTH at station 20 is without or void of a container such as CT. This will be mentioned further hereinafter.

There is further shown in FIG. 36 additional circuits which extend over conductor CPC to relay CPR (FIG. 33) for energization of such relay. Such circuits are associated with stations 21, 22 and 23 and the circuits associated with station 21 include contacts *a–b* of relay 21CTR in multiple with contacts *a–b* of a limit switch 21LS, similar to limit switch 20LS discussed above, and a diode D21. The circuits associated with station 22 include contacts *a–b* of relay 22CTR in multiple with contacts *a–b* of a limit switch 22LS, similar to limit switches 20LS and 21LS, and a diode D22. Station 23 has associated therewith circuits including contacts *a–b* of relay 23CRT in multiple with contacts *a–b* of a limit switch 23LS, similar to the limit switches mentioned above, and a diode D23. The contacts *a* of each of the relays and each of the limit switches mentioned above are connected to terminal B of the current source and when any of such relays are energized or any of the limit switches are actuated to close their contacts *a–b*, relay CPR is energized over conductor CPC.

Indication lights 21IL, 22IL and 23IL are provided and are associated with stations 21, 22 and 23, respectively. One side of the filaments of such lights are connected in multiple with contacts *b* of the respectively associated limit switch –LS and relay –CTR, and the second side of such filaments are connected to terminal N of the current source. Thus, each respective light is energized to give an indication whenever contacts *a–b* of limit switch –LS or of relay –CTR associated with the respective light are closed. Indication light or lamp M1L on control panel MCP (FIG. 33) is energized when any one of the containers in the holders at stations 20 through 23 is full (the count manually selected on a respective counter 20CT through 23CT has been reached) or when any one of the limit switches 20LS through 23LS is energized, the circuit for energizaton of such indication lamp extending from the aforesaid conductor CPC connected to relay CPR and thence to one end of the filament of lamp M1L and through such filament to terminal N of the current source. Lamp M1L is also energized from conductor CPC whenever counter 1CT (FIG. 32) associated with station 1 has reached the end of its preselected count for which such counter is manually set. It is pointed out that diodes D20 through D23 provide for the energization of indication lamps 20IL through 23IL, respectively, only when –LS or the contacts *a–b* of switches of the –CTR relays associated with each respective lamp are closed. Thus, when indication lamp or light M1L on control panel MCP is energized, it indicates to personnel that either the counter at station 1 has reached the end of its count, that the container at one of the stations 20 through 23 is full or that a container is missing from the container holder at one of said stations 20 through 23. The individual lights or lamps associated with stations 1, stations 20 through 23 and station 32 indicate where and/or what action must be taken to provide for restarting of the apparatus of the invention previous to the depressing of push button START on control panel MCP.

It is pointed out that the counts manually selected on counters 20CTR through 23CTR depend on the number of capacitors that a container such as CT will hold which, in turn, depends on the size of the capacitors in each lot or batch of capacitors being tested and sorted, each such lot or batch comprising, of course, a plurality of the same size capacitors. Each container such as CT can accommodate or hold a different predetermined number of capacitors of any one of different sizes and such containers, after filling thereof, may be used for storing or shipping of a quantity of capacitors of a certain size. However it is not necessary that containers such as CT be used with the apparatus of the invention but, if it is so desired, the capacitors sorted at stations 20 through 23 can be dropped into suitable receiving bins as at the reject stations 17 and 19. However, it is highly desirable, although not necessary, that the capacitors sorted at stations 20 through 23 and dropped into respective classification bins be counted as by the counters 20CT through 23CT, or by other suitable counters.

It is also pointed out that, with the addition of sorting devices at one or more of the stations 24 through 31 and additional apparatus such as classification transfer relays associated with each additional sorting station and similar to those discussed above, the apparatus of the invention can be modified to sort capacitors into several more capacitance classifications or categories than the four acceptable classifications hereinbefore discussed. It is believed that this will be readily apparent to those skilled in the art.

Although there is herein shown and discussed in detail only one form of apparatus embodying the invention, it will be understood that such is not to be considered in any way limiting but that many changes and modifications may be made in the apparatus within the purview of the appended claims without departing from the spirit and scope thereof.

What is claimed is:

1. Apparatus for automatically testing and sorting a succession of similar cylindrical capacitors having axial leads and sequentially transported through a first path of travel to a loading station for transfer of each said capacitor successively to said apparatus, such apparatus comprising, in combination;

A. a capacitor conveyor having a capacitor receiving station located adjacent said loading station and carrying a succession of capacitor clamping assemblies;

B. means at said receiving station for successively transferring each said capacitor arriving at said loading station to said receiving station and thereby to said conveyor;

C. motor means for imparting periodic movements to said conveyor to successively convey said capacitors received at said receiving station through a second path of travel including, in sequence, such receiving station, a succession of capacitor electrical charge stations, a capacitor current leakage testing station, a capacitor electrical discharge station, a first capacitor reject station, an electrical capacitance testing station, a second capacitor reject station, and a succession of capacitor sorting stations, there being on said conveyor one of said capacitor clamping assemblies for each said station in said second path of travel;

D. a vertically reciprocative tool plate supported above said conveyor for movement between raised and lowered positions, such tool plate supporting,
 a. at said receiving station, an opener for said clamping assemblies;
 b. at each of said electrical charge, testing, and discharge stations, a capacitor lead contacting device; and
 c. at each of said reject and sorting stations, an actuable opener for said clamping assemblies for selectively releasing capacitors clamped and carried thereby;
 d. said motor means imparting said vertically reciprocative movement to said tool plate during dwell periods between said periodic movements of said conveyor, such tool plate briefly dwelling in its said lowered position at the end of each movement to such position;

E. means associated with each said electrical charge station for supplying through said capacitor lead contacting device, at each such charge station, an electrical charge to each capacitor moved to each respective charge station;

F. means associated with said current leakage testing station for testing, through said capacitor lead contacting device at such testing station, the current leakage of each capacitor moved to such station, such testing means providing a reject leakage classification for each said capacitor tested and having unsatisfactory leakage characteristics;

G. means associated with said electrical discharge station for discharging, through said capacitor lead contacting device at such discharge station, each of said capacitors moved to such station;

H. means for transferring each said reject leakage classification for a capacitor along with the respective capacitor as it is conveyed through said electrical discharge station to said first capacitor reject station;

I. means at said first reject station, and responsive to said classification transferring means, for actuating said actuable opener at such reject station to open each clamping assembly which is carried thereto and which is conveying a capacitor with a reject leakage classification, each such opening of a clamping assembly releasing into a reject bin the capacitor then being conveyed by the respective assembly;

J. means associated with said electrical capacitance testing station for testing, through said capacitor lead contacting device at such testing station, the capacitance of each capacitor moved to such station, such testing means providing a capacitance classification for each said capacitor tested;

K. means for transferring each said capacitance classification for a capacitor along with the respective capacitor during its conveyance from said capacitance testing station to said second reject station and sorting stations;

L. means at said second reject station, and responsive to said capacitance classification transferring means, for actuating said actuable opener at such reject station to open each clamping assembly which is carried thereto and which is conveying a capacitor with a capacitance classification which is without the limits of a selected range of capacitance, each such opening of a clamping assembly releasing into a reject bin the capacitor then being carried by the respective assembly; and M. means at each of said sorting stations for selectively actuating said actuable opener at each of the respective such stations to open said clamping assemblies carried thereto to thereby release capacitors carried by such assemblies, each such actuation of a clamping assembly opener being selected by said capacitance classification transferring means to release each capacitor into a container respectively associated with the capacitance classification of such capacitor.

2. Apparatus in accordance with claim 1 and further including a counting means associated with each of said reject and sorting stations for counting the number of capacitors released at each respective such station.

3. Apparatus in accordance with claim 2 further including a counting means associated with said receiving station for counting the number of capacitors received by the apparatus.

4. Apparatus in accordance with claim 3 and in which said second path of travel is a circular path, said conveyor is a circular turret which is periodically moved between said stations in said path, and said tool plate is a circular plate in vertical axial alignment with said turret.

5. Apparatus in accordance with claim 2 and further including means, controlled by said counting means, for interrupting said periodic movements of said conveyor when a selected number of capacitors are counted by one of said counting means.

6. Apparatus in accordance with claim 5 and in which said second path of travel is a circular path, said conveyor is a circular turret which is periodically moved between said stations in said path, and said tool plate is a circular plate in vertical axial alignment with said turret.

7. Apparatus in accordance with claim 2 and in which said second path of travel is a circular path, said conveyor is a circular turret which is periodically moved between said stations in said path, and said tool plate is a circular plate in vertical axial alignment with said turret.

8. Apparatus in accordance with claim 1 and further including a counting means associated with said receiving station for counting the number of capacitors received by the apparatus.

9. Apparatus in accordance with claim 8 and in which said second path of travel is circular path, said conveyor is a circular turret which is periodically moved between said stations in said path, and said tool plate is a circular plate in vertical axial alignment with said turret.

10. Apparatus in accordance with claim 1 and further including means, at an additional station beyond said sorting stations, for detecting a capacitor in a clamping assembly arriving at such additional station; and means controlled by said detecting means for interrupting said periodic movements of said conveyor when a capacitor is detected at such additional station.

11. Apparatus in accordance with claim 10 and in which said second path of travel is a circular path, said conveyor is a circular turret which is periodically moved between said stations in said path, and said tool plate is a circular plate in vertical axial alignment with said turret.

12. Apparatus in accordance with claim 1 and in which said second path of travel is a circular path, said conveyor is a circular turret which is periodically moved between said stations in said path, and said tool plate is a circular plate in vertical axial alignment with said turret.

13. Apparatus for automatically testing direct current leakage and the capacitance of each of a plurality of cylindrical capacitors having axial leads and sequentially moved through a first path of travel to a capacitor delivery station, and for sorting said capacitors in accordance with the results of said leakage and capacitance tests, such apparatus comprising, in combination;
   A. a circular turret rotatably movable between a plurality of stations in a second path of travel and including,
      a. a capacitor receiving station adjacent said delivery station,
      b. a succession of capacitor electrical charge stations beyond said receiving station,
      c. a direct current leakage test station beyond said succession of charge stations,
      d. a capacitor electrical discharge station beyond said leakage test station,
      e. a first reject station for capacitors failing said direct current leakage test,
      f. a capacitance test and classification station,
      g. a second reject station for capacitors determined at said capacitance test station as having a capacitance outside of a selected range of satisfactory capacitance ratings for the capacitors, and
      h. a succession of capacitance classification sorting stations for sorting capacitors in accordance with the classifications therefor determined at said capacitance test and classification station;
   B. a vertically reciprocative circular tool plate disposed above said circular turret in axial alignment therewith;
   C. motor means for periodically moving said turret between said plurality of stations with a brief dwell period at each such station and for lowering and raising said tool plate during each such dwell period with a brief dwell period of the tool plate at the lowered position thereof;
   D. a plurality of capacitor clamp assemblies carried on the upper surface of said turret at positions equally spaced apart about and adjacent the outer periphery of the turret, such positions corresponding in number to said plurality of stations and such assemblies being normally biased to closed clamping condition and actuable to an open unclamping condition by suitable opener devices;
   E. an opener device supported on said tool plate and actuable thereby to open a capacitor clamp assembly at said capacitor receiving station each time such tool plate is moved to its said lowered position;
   F. means, driven by said motor means in a time relationship with the movements of said turret, for transferring each capacitor moved to said capacitor delivery station to an opened clamp assembly then dwelling at said capacitor receiving station;
   G. a capacitor lead contacting device at each of said capacitor electrical charge stations, said leakage test station, said discharge station and said capacitance test station, each such device being actuated to contact the leads of a capacitor at the respective station when said tool plate is moved to its lowered position;
   H. electrical means for supplying, through each said lead contacting device at a respective charge station, an electrical charge to each capacitor whose leads are contacted by the device at the respective charge station;
   I. means for testing, through said lead contacting device at said current leakage test station, the direct current leakage of each capacitor whose leads are contacted by the contacting device at such test station, such means producing a first reject signal for each capacitor tested as having undesirable leakage characteristics, each such signal being associated and transferred along with each respective reject capacitor as it is moved to said first reject station;
   J. means for electrically discharging, through said lead contacting device at said electrical discharge station, each capacitor whose leads are contacted by the contacting device at such discharge station;
   K. an actuable clamp assembly opener at said first reject station, such opener being actuated to open a capacitor clamp assembly when said tool plate is moved to its said lowered position and the respective capacitor then in the clamp assembly at such reject station has associated therewith one of said first reject signals, each such opening of said clamp assembly releasing the respectively rejected capacitor into a first reject bin;
   L. means for testing, through said lead contacting device at said capacitance test and classification station, the capacitance of each said capacitor whose leads are contacted by the contacting device at such test station, such means producing a second reject signal for each capacitor tested as having a capacitance rating outside of said selected range of capacitance ratings and a capacitance classification signal for each capacitor tested as having one of the capacitance ratings within said selected range of ratings, each second reject signal and each classification signal being associated with the respective capacitor whose testing produced the respective signal and each such signal being transferred along with the respectively associated capacitor as it is moved to said second reject station and to one of said sorting stations;
   M. an actuable clamp assembly opener at said second reject station, such opener being actuated to open a capacitor clamp assembly when said top plate is moved to its said lowered position and the respective capacitor then in the clamp assembly at such reject station has associated therewith one of said second reject signals, each such opening of said clamp assembly releasing the respectively rejected capacitor into a second reject bin; and
   N. an actuable clamp assembly opener at each of said capacitance classification sorting stations, each such opener being actuated to open a capacitor clamp assembly at the respective sorting station when said top plate is moved to its said lowered position and a capacitor then at a respective one of such sorting stations has associated therewith a capacitance classification corresponding to the capacitance classification of such sorting station, each such opening of a clamp assembly at one of said sorting stations releasing a capacitor into a container having associated therewith a classification corresponding to the capacitance classification of said capacitor at such one sorting station.

14. Apparatus in accordance with claim 13 and further including a separate counting means associated with each of said receiving and sorting stations for counting the quantity of capacitors received at such receiving station and released at each respective sorting station, respectively, each such counting means being manually operable to select desired maximum total quantities of capacitors to be counted; and means controlled by each said counting means for interrupting the movements of said turret and tool plate when any one of such counting means counts a quantity of capacitors corresponding to the maximum count manually selected for the respective counting means.

15. Apparatus in accordance with claim 14 and further including counting means associated with each said reject station for counting the quantity of capacitors released at each respective such station.

* * * * *